US007247418B2

(12) United States Patent
Saraiya et al.

(10) Patent No.: US 7,247,418 B2
(45) Date of Patent: Jul. 24, 2007

(54) IMAGEABLE MEMBERS WITH IMPROVED CHEMICAL RESISTANCE

(75) Inventors: Shashikant Saraiya, Fort Collins, CO (US); Jayanti Patel, Fort Collins, CO (US); Ting Tao, Fort Collins, CO (US); Kevin B Ray, Fort Collins, CO (US); Frederic E. Mikell, Greeley, CO (US); James L. Mulligan, Fort Collins, CO (US); John Kalamen, Loveland, CO (US); Scott A. Beckley, Windsor, CO (US); Eric Clark, Loveland, CO (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 11/293,554

(22) Filed: Dec. 1, 2005

(65) Prior Publication Data

US 2007/0128546 A1 Jun. 7, 2007

(51) Int. Cl.
*G03F 7/11* (2006.01)
*G03F 7/039* (2006.01)
*G03F 7/30* (2006.01)

(52) U.S. Cl. ............................... 430/271.1; 430/270.1; 430/278.1; 430/302; 430/325; 430/326; 430/905; 430/910; 430/964

(58) Field of Classification Search ............. 430/271.1, 430/278.1, 905, 910, 964, 17, 18, 302, 325, 430/326, 270.1
See application file for complete search history.

(56) References Cited

U.S. PATENT DOCUMENTS

| | | | | |
|---|---|---|---|---|
| 3,220,832 | A * | 11/1965 | Uhlig | 430/60 |
| 5,965,319 | A | 10/1999 | Kobayashi | |
| 6,013,416 | A | 1/2000 | Nozaki et al. | |
| 6,200,725 | B1 | 3/2001 | Takechi et al. | |
| 6,294,311 | B1 | 9/2001 | Shimazu et al. | |
| 6,309,792 | B1 | 10/2001 | Hauck et al. | |
| 6,333,133 | B1 * | 12/2001 | Nakamura et al. | 430/270.1 |
| 6,352,811 | B1 | 3/2002 | Patel et al. | |
| 6,352,812 | B1 | 3/2002 | Shimazu et al. | |
| 6,358,669 | B1 | 3/2002 | Savariar-Hauck et al. | |
| 6,528,228 | B2 | 3/2003 | Hauck et al. | |
| 6,593,055 | B2 | 7/2003 | Shimazu et al. | |
| 6,670,499 | B1 * | 12/2003 | Inoue et al. | 560/117 |
| 6,893,797 | B2 | 5/2005 | Munnelly et al. | |
| 2003/0013042 | A1 * | 1/2003 | Brabbs et al. | 430/271.1 |
| 2003/0157434 | A1 * | 8/2003 | Oda et al. | 430/273.1 |
| 2004/0018445 | A1 | 1/2004 | Akita et al. | |
| 2004/0067432 | A1 | 4/2004 | Kitson et al. | |
| 2005/0037280 | A1 | 2/2005 | Loccufier et al. | |
| 2006/0046198 | A1 * | 3/2006 | Hunter et al. | 430/276.1 |

FOREIGN PATENT DOCUMENTS

| | | |
|---|---|---|
| EP | 0 924 102 | 6/1999 |
| EP | 1 031 412 | 8/2000 |
| EP | 1 120 246 | 8/2001 |
| EP | 1 208 974 | 5/2002 |

OTHER PUBLICATIONS

"High etch-resistant EB resists employing adamantyl protective groups and their application for 248-nm lithography" by Nozaki et al, J.Photo Sci and Tech., vol. 13, No. 3(2000).
"Pharmakologisch aktive Polymere,9*" by Ringsdorf et al, Inst. Organ.Chem., vol. 177, pp. 741-746 (1976).
"Impact of 2-Methyl-2-Adamantyl Group Used for 193-nm Single-Layer Resist" by Takechi et al, J.Photo.Sci Tech., vol. 9, No. 2(1996).

* cited by examiner

*Primary Examiner*—Richard L. Schilling
(74) *Attorney, Agent, or Firm*—J. Lanny Tucker

(57) ABSTRACT

Both single-layer and multilayer imageable elements have a substrate and at least one imageable layer. The elements can be used to prepare either negative- or positive-working imaged elements, for example as lithographic printing plates. The imageable elements also include a radiation absorbing compound and a solvent-resistant polymer comprising pendant phosphoric acid groups, pendant adamantyl groups, or both. When this polymer comprises pendant adamantyl groups, they are connected to the polymer backbone through a urea or urethane group. The imageable elements have improved chemical resistance and thermal bakeability from the presence of the unique solvent-resistant polymer.

43 Claims, No Drawings

IMAGEABLE MEMBERS WITH IMPROVED CHEMICAL RESISTANCE

FIELD OF THE INVENTION

This invention relates to both negative- and positive-working imageable elements having imaging layers with improved chemical resistance and thermal bakeability due to the presence of a particular solvent-resistant polymer. This invention also relates to methods of imaging to provide negative- or positive-working imaged elements.

BACKGROUND OF THE INVENTION

In conventional or "wet" lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. For example, the ink can be first transferred to an intermediate blanket that in turn is used to transfer the ink to the surface of the material upon which the image is to be reproduced.

Recent developments in the field of printing plate precursors concern the use of lasers or laser diodes for imaging. Laser exposure does not require conventional silver halide graphic arts films as intermediate information carriers (or "masks") since the lasers can be controlled directly by computers. High-performance lasers or laser-diodes that are used in commercially-available image-setters generally emit radiation having a wavelength of at least 700 nm, and thus the radiation-sensitive compositions are required to be sensitive in the near-infrared or infrared region of the electromagnetic spectrum. However, other useful radiation-sensitive compositions are designed for imaging with ultraviolet or visible radiation.

Imageable elements useful to prepare lithographic printing plates typically comprise an imageable layer applied over the hydrophilic surface of a substrate. The imageable layer includes one or more radiation-sensitive components that can be dispersed in a suitable binder. Alternatively, the radiation-sensitive component can also be the binder material. Following imaging, either the imaged regions or the non-imaged regions of the imageable layer are removed by a suitable developer, revealing the underlying hydrophilic surface of the substrate. If the imaged regions are removed, the element is considered as positive-working. If the non-imaged regions are removed, the element is considered as negative-working. In each instance, the regions of the imageable layer (that is, the image areas) that remain are ink-receptive, and the regions of the hydrophilic surface revealed by the developing process accept water and aqueous solutions (typically a fountain solution) and repel ink.

Imaging of the imageable element with ultraviolet and/or visible radiation is typically carried out through a mask that has clear and opaque regions. Imaging takes place in the regions under the clear regions of the mask but does not occur in the regions under the opaque mask regions. Use of a mask is time-consuming and has a number of significant disadvantages.

Direct digital imaging has obviated the need for imaging through a mask and is becoming increasingly important in the printing industry. Imageable elements for the preparation of lithographic printing plates have been developed for use with infrared lasers. Thermally imageable, multi-layer elements are described, for example, U.S. Pat. No. 6,294,311 (Shimazu et al.), U.S. Pat. No. 6,352,812 (Shimazu et al.), U.S. Pat. No. 6,593,055 (Shimazu et al.), U.S. Pat. No. 6,352,811 (Patel et al.), U.S. Pat. No. 6,358,669 (Savariar-Hauck et al.), and U.S. Pat. No. 6,528,228 (Savariar-Hauck et al.), U.S. patent application Publication 2004/0067432 A1 (Kitson et al.).

U.S. patent application Publication 2005/0037280 (Loccufier et al.) describes heat-sensitive printing plate precursors that comprise a phenolic developer-soluble polymer and an infrared radiation absorbing compound in the same layer.

Radiation-sensitive compositions and imageable elements have also been designed for imagewise exposure and/or development while on a printing press using fountain solutions and/or printing inks, as described for example in U.S. Pat. No. 6,582,882 (Pappas et al.) and U.S. Pat. No. 6,899,994 (Huang et al.), U.S. patent application Publication 2004/0260050 (Munnelly et al.), and WO 2004/101280 (Munnelly et al.). These imageable elements typically comprise a single imageable layer on the substrate.

U.S. Pat. No. 6,200,725 (Takechi et al.) and U.S. patent application Publication 2004/0018445 (Akita et al.) describe chemically amplified resist compositions and processes for forming resist patterns using polymers containing pendant adamantyl groups.

PROBLEM TO BE SOLVED

In use, lithographic printing plates (both negative- and positive-working) come into contact with fountain solutions and inks. In addition, the elements may be subjected to blanket washes to remove inks and various cleaning solutions for blanket and press rollers. While the lithographic printing literature describes various imageable elements with advantageous properties, there is a continuing need to improve on the various properties of such elements and especially to provide increased resistance to various chemicals and solvents used in development and printing. It is also desired to improve the post-development thermal baking properties of the imaged elements.

SUMMARY OF THE INVENTION

The present invention provides an imageable element comprising a substrate having thereon an imageable layer, the element further comprising a radiation absorbing compound and a solvent-resistant polymer comprising a polymer backbone and pendant phosphoric acid groups, pendant adamantyl groups, or both, provided that the adamantyl groups are connected to the polymer backbone through a urea or urethane linking group.

In some embodiments, the imageable layer is the only imaging layer comprising the solvent-resistant polymer and the radiation absorbing compound and that is disposed on the substrate in the element.

The imageable elements can be either negative- or positive-working elements. Such negative-working imageable elements generally include a free-radical polymerizable compound and a free-radical generating composition in the imaging layer with the solvent-resistant polymer and an IR absorbing compound.

In other embodiments, the imageable elements are positive-working and comprise on the substrate, in order:

an inner layer comprising the radiation absorbing compound and the solvent-resistant polymer comprising pendant phosphoric acid groups, pendant adamantyl groups, or both, as described herein, and an ink receptive outer layer that is not removable using alkaline developer before its exposure to imaging radiation.

This invention also provides a method for forming an image comprising:

A) thermally imaging the imageable element of the present invention, thereby forming an imaged element with imaged and non-imaged regions, B) contacting the imaged layer with an alkaline developer to remove either only the imaged regions or only the non-imaged regions, and C) optionally, baking said imaged and developed element.

Where only the imaged regions are removed, the invention provides a positive-working imaged element (such as a lithographic printing plate precursor), and where only the non-imaged regions are removed, the invention provides a negative-working imaged element.

The imageable elements have increased "chemical resistance", that is resistance to breakdown of the various layers from chemicals and solvents used in development and printing. This property is achieved by the presence of a particular solvent-resistant polymer containing pendant phosphoric acid groups, pendant adamantyl groups, or both in one of the layers on the substrate. It has also been observed that the use of these solvent-resistant polymers provides improved thermal bakeability, that is, resistance to breaking down when the element is heated after development to improve shelf life.

DETAILED DESCRIPTION OF THE INVENTION

Definitions

Unless the context indicates otherwise, when used herein, the terms "imageable element" and "printing plate precursor" are meant to be references to embodiments of the present invention.

By "single-layer" imageable element, we mean an imageable element of this invention that has only a single layer needed for providing a positive or negative image. The "solvent-resistant polymer" (defined below) would be located in this single imaging layer that may be the outermost layer. However, such elements may comprise additional non-imaging layers [such as subbing layers or an overcoat comprising an oxygen-impermeable, water-soluble polymer such as a poly(vinyl alcohol)] on either side of the substrate.

By "multilayer" imageable element, we mean an imageable element of this invention that has at least two layers required for providing an image, for example, "inner" and "outer" layers as described below. The "solvent-resistant polymer" (defined below) would usually be located in the inner layer. However, such elements may comprise additional non-imaging layers on either side of the substrate, including but not limited to overcoat, subbing, and adhesion layers.

The term "solvent-resistant polymer" refers to the polymers defined herein that comprise pendant phosphoric acid groups, pendant adamantyl groups, or both types of pendant groups. These solvent-resistant polymers are described in more detail below.

In addition, unless the context indicates otherwise, the various components described herein such as "solvent-resistant polymer", "polymeric materials", "phenolic resin binder", "dissolution inhibitor", "added copolymer", "coating solvent", "radiation absorbing compound", "alkaline developer", and similar terms also refer to mixtures of such components. Thus, the use of the article "a" or "an" is not necessarily meant to refer to only a single component.

Unless otherwise indicated, percentages refer to percents by dry weight.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287–2311 (1996). However, any definitions explicitly set forth herein should be regarded as controlling.

Unless otherwise indicated, the term "polymer" refers to high and low molecular weight polymers including oligomers and includes homopolymers and copolymers.

The term "copolymer" refers to polymers that are derived from two or more different monomers. That is, they comprise recurring units having at least two different chemical structures.

The term "backbone" refers to the chain of atoms in a polymer to which a plurality of pendant groups can be attached. An example of such a backbone is an "all carbon" backbone obtained from the polymerization of one or more ethylenically unsaturated polymerizable monomers. However, other backbones can include heteroatoms wherein the polymer is formed by a condensation reaction or some other means.

Uses

The imageable elements can be used to provide imaged elements for various purposes. The preferred use is as lithographic printing plate precursors as described in more detail below. However, this is not meant to be the only use of the present invention. For example, the imageable elements can also be used as thermal patterning systems and to form masking elements and printed circuit boards.

Solvent-Resistant Polymers

The solvent-resistant polymers that provide the advantages of this invention are addition or condensation polymers that have a polymer backbone to which are attached pendant phosphoric acid groups, pendant adamantyl groups, or both types of pendant groups. The pendant adamantyl groups are connected to the polymer backbone at least through a urea or urethane linking group but other linking groups can also be present.

Preferred solvent-resistant polymers can be represented by the following Structure (I):

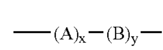

$$—(A)_x—(B)_y— \qquad \text{I}$$

wherein A and B together represents the polymer backbone in which A further comprises recurring units comprising pendant phosphoric acid groups, pendant adamantyl groups, or both, B further represents different recurring units, x represents 5 to 100 weight %, and y represents 0 to 95 weight %, provided that if A comprises pendant adamantyl groups, such groups are connected to the polymer backbone through a urea or urethane linking group (but other linking groups can also be present).

More preferably, the solvent-resistant polymer can be represented by the following Structure (II):

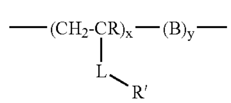

wherein R represents hydrogen, a substituted or unsubstituted lower alkyl group having 1 to 4 carbon atoms (such as methyl, ethyl, n-propyl, or t-butyl), or a halo group (such as fluoro, chloro, bromo, or iodo).

L represents a direct bond or a linking group comprising 1 or more carbon atoms and optionally 1 or more heteroatoms in the linking chain. Useful linking groups can include, but are not limited to, substituted or unsubstituted, linear or branched alkylene groups having 1 to 10 carbon atoms (such as methylene, methoxymethylene, ethylene, iso-propylene, n-butylene, t-butylene, and n-hexylene), substituted or unsubstituted cycloalkylene groups having 5 to 10 carbon atoms in the cyclic group (such as 1,3-cyclopentylene and 1,4-cyclohexylene), substituted or unsubstituted arylene groups having 6 to 10 carbon atoms in the cyclic group (such as 1,4-phenylene, 3-methyl-1,4-phenylene, or naphthylene), or combinations thereof, such as arylenealkylene, alkylenearylene (for example, methylene-1,4-phenylene), and alkylenearylenealkylene groups. The L linking groups can also include one or more oxy, thio, amido, carbonyl, oxycarbonyl, carbonyloxy, carbonamido, sulfonamido, urea, urethane, and carbonate [—O—C(O)—O—] groups within the linking chain, with or without any of the alkylene, cycloalkylene, and arylene groups described above. L can include combinations of two or more of these groups.

Preferably, L is a direct bond or one or more of alkylene groups having 1 to 4 carbon atoms in the linking chain, carbonyloxy, urea, urethane, alkyleneoxy, alkylenecarbonyloxy, and carboxyalkylene groups.

More preferably, L comprises at least one —C(O)O— (carbonyloxy), —NH—CO—NH— (urea), —C(O)—O—$(CH_2)_2$—, or —NH—CO—O— (urethane) group.

In Structure (II), R' represents a pendant phosphoric acid group, a pendant adamantyl group, or both types of pendant groups. The solvent-resistant polymer can comprise one or more different recurring units having phosphoric acid groups or one or more different recurring units having adamantyl groups. Alternatively, the polymer can include a mixture of one or more different recurring units having phosphoric acid groups and one or more different recurring units having adamantyl groups. When R' is a pendant adamantyl group, L comprises a urea or urethane linking group within the linking chain.

In referring to "phosphoric acid" groups, it is also intended to include the corresponding salts of the phosphoric acid, including but not limited to, alkali metal salts and ammonium salts. Any suitable positive counterion can be used with the pendant phosphoric acid groups as long as the counterion does not adversely affect the performance of the resulting polymer or other desired imaging properties.

In more preferred embodiments of Structures I and II, x is from about 5 to about 20 weight % and y is from about 80 to about 95 weight % when A represents recurring units comprising pendant phosphoric acid groups. Alternatively, x is from about 5 to about 40 weight % and B is from about 60 to about 95 weight % when A represents recurring units comprising pendant adamantyl groups.

Particularly useful ethylenically unsaturated polymerizable monomers that can used to provide the "A" recurring units described above include, but are not limited to the following compounds represented by the following Structures A1 through A5:

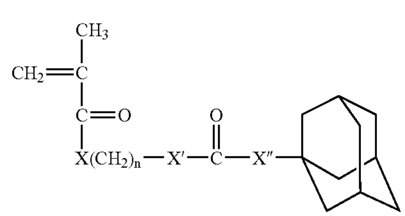

wherein X is oxy, thio, or —NH— (preferably oxy), X' is —NH— or oxy, X" is oxy or —NH—, and n is 1 to 6 (preferably 2 to 4).

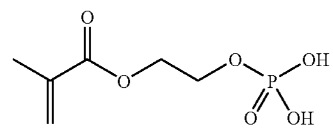

Ethylene glycol methacrylate phosphate

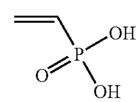

Vinyl phosphonic acid

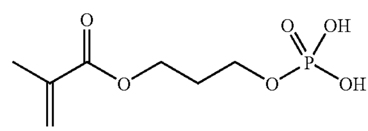

1,3-Propylene glycol methacrylate phosophate

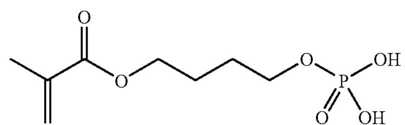

1,4-n-Butylene glycol methacrylate phosphate

In Structures (I) and (II), B represents recurring units derived from a one or more ethylenically unsaturated polymerizable monomers that do not have pendant phosphoric acid groups or adamantyl groups. A variety of monomers can be used for providing B recurring units, including styrenic monomers, (meth)acrylamide, (meth)acrylic acids or esters thereof, (meth)acrylonitrile, vinyl acetate, maleic anhydride, N-substituted maleimide, or mixtures thereof. However, more particularly useful monomers are represented by the following Structures (III) through (VII):

$$R^1R^2C{=}CR^3(R^4) \qquad \text{(III)}$$

-continued (IV)

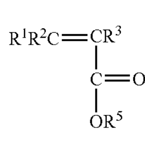

(V)

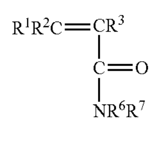

(VI)

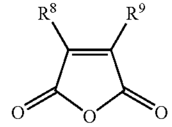

(VII)

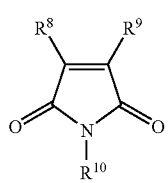

wherein $R^1$ and $R^2$ are independently hydrogen, substituted or unsubstituted alkyl groups having 1 to 6 six carbon atoms, substituted or unsubstituted alkenyl groups having 1 to 6 carbon atoms, substituted or unsubstituted phenyl groups, halo groups, substituted or unsubstituted alkoxy groups having 1 to 6 carbon atoms, substituted or unsubstituted acyl groups having 1 to 6 carbon atoms, substituted or unsubstituted acyloxy groups having 1 to 6 carbon atoms, or $R^1$ and $R^2$ together can form a cyclic group, such as a cyclopentyl or cyclohexyl group or form one of the following divalent groups: $—NHC(O)CH_2CH_2CH_2—$, $—NHC(O)CH_2CH_2—$, $—CH_2C(O)OC(O)—$, $—(CH_2)_2C(O)OC(O)—$, and $—CH_2C(O)OC(O)CH_2—$. $R^1$ and $R^2$ are preferably hydrogen or methyl.

$R^3$ is hydrogen or a substituted or unsubstituted alkyl group having 1 to 6 carbon atoms, substituted or unsubstituted phenyl group, or halo group. $R_3$ is preferably hydrogen or methyl.

$R^4$ is hydrogen or a substituted or unsubstituted alkyl group having 1 to 6 carbon atoms, substituted or unsubstituted phenyl group, or halo group. $R^4$ is preferably a substituted or unsubstituted phenyl group (that is, to provide a styrenic monomer).

$R^5$ is hydrogen or a substituted or unsubstituted alkyl group having 1 to 20 carbon atoms, substituted or unsubstituted alkenyl group having 1 to 20 carbon atoms, substituted or unsubstituted cycloalkyl group, substituted or unsubstituted cycloalkenyl group, substituted or unsubstituted phenyl group, or substituted or unsubstituted alkoxyalkylene group having 1 to 20 carbon atoms. $R^5$ is preferably methyl or ethyl.

$R^6$ and $R^7$ are independently hydrogen or substituted or unsubstituted alkyl groups having 1 to 20 carbon atoms, substituted or unsubstituted alkenyl groups having 1 to 20 carbon atoms, substituted or unsubstituted cycloalkyl groups, substituted or unsubstituted cycloalkenyl groups, substituted or unsubstituted phenyl groups, or substituted or unsubstituted alkoxyalkylene groups having 1 to 12 carbon atoms. $R^6$ and $R^7$ are preferably independently hydrogen or methyl.

$R^8$ and $R^9$ are independently hydrogen or substituted or unsubstituted alkyl groups having 1 to 6 carbon atoms, substituted or unsubstituted alkenyl groups having 1 to 6 carbon atoms, substituted or unsubstituted phenyl groups, halo groups, cyano groups, substituted or unsubstituted alkoxy groups having 1 to 6 carbon atoms, substituted or unsubstituted acyl groups having 1 to 6 carbon atoms, or substituted or unsubstituted acyloxy groups having 1 to 6 carbon atoms. $R^8$ and $R^9$ are independently preferably hydrogen, methyl, or phenyl.

$R^{10}$ is hydrogen or a substituted or unsubstituted alkyl group having 1 to 7 carbon atoms (including a benzyl group), substituted or unsubstituted phenyl group, or hydroxy group. $R^{10}$ is generally hydrogen or a substituted or unsubstituted phenyl group.

Preferably, the recurring units represented by B are derived from styrene, N-phenylmaleimide, methacrylic acid, (meth)acrylonitrile, or methyl methacrylate, or mixtures of two or more of these monomers.

In some preferred embodiments for the multi-layer imageable elements (described below), the solvent-resistant polymer is represented by Structure (II) described above in which the x is from about 5 to about 30 weight % (more preferably, from about 5 to about 20 weight %) and B represents recurring units derived from:

a) one or more of styrene, N-phenylmaleimide, methacrylic acid, and methyl methacrylate, wherein these recurring units comprise from 0 to about 70 weight % (more preferably from about 10 to about 50 weight %) of all recurring units in the solvent-resistant polymer, and b) one or more of acrylonitrile or methacrylonitrile, or mixtures thereof, wherein these recurring units comprise from about 20 to about 95 weight % (more preferably from about 20 to about 60 weight %) of all recurring units in the solvent-resistant polymer.

The solvent-resistant polymers useful in this invention can be prepared using known polymerization techniques depending upon the starting materials. If condensation polymers are prepared and used, the starting materials are generally dibasic carboxylic acids and dibasic alcohols, either of which can include the desired pendant phosphoric acid or adamantyl groups.

More preferably, the solvent-resistant polymers are prepared from ethylenically unsaturated polymerizable monomers using conditions, reactants, and catalysts suitable for free radical (or "addition") polymerization that are well known to those skilled in the art and that are described, for example, in Chapters 20 and 21, of *Macromolecules*, Vol. 2, 2nd Ed., H. G. Elias, Plenum, N.Y., 1984. Useful free radical initiators are peroxides such as benzoyl peroxide, hydroperoxides such as cumyl hydroperoxide and azo compounds such as 2,2'-azobis(isobutyronitrile) (AIBN). Suitable reaction solvents include liquids that are inert to the reactants and that will not otherwise adversely affect the reaction.

Single-Layer Imageable Elements

The single-layer imageable elements can be either negative- or positive-working imageable elements depending upon the imaging chemistry used. The solvent-resistant polymers described herein are generally present as binders in the imaging layers of these elements.

In general, the single-layer imageable elements are formed by suitable application of an imaging formulation containing one or more solvent-resistant polymers to a suitable substrate to form an imageable layer. This substrate is usually treated or coated in various ways as described below prior to application of the formulation. The substrate can be treated to provide an "interlayer" for improved adhesion or hydrophilicity, and the single imaging layer is applied over the interlayer.

The substrate generally has a hydrophilic surface, or at least a surface that is more hydrophilic than the applied imaging formulation on the imaging side. The substrate comprises a support that can be composed of any material that is conventionally used to prepare imageable elements such as lithographic printing plates. It is usually in the form of a sheet, film, or foil, and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

Polymeric film supports may be modified on one or both surfaces with a "subbing" layer to enhance hydrophilicity, or paper supports may be similarly coated to enhance planarity. Examples of subbing layer materials include but are not limited to, alkoxysilanes, amino-propyltriethoxysilanes, glycidioxypropyl-triethoxysilanes, and epoxy functional polymers, as well as conventional hydrophilic subbing materials used in silver halide photographic films (such as gelatin and other naturally occurring and synthetic hydrophilic colloids and vinyl polymers including vinylidene chloride copolymers).

A preferred substrate is composed of an aluminum support that may be coated or treated using techniques known in the art, including physical graining, electrochemical graining, chemical graining, and anodizing. Preferably, the aluminum sheet is anodized using phosphoric acid or sulfuric acid and conventional procedures.

An optional interlayer may be formed by treatment of the aluminum support with, for example, a silicate, dextrine, calcium zirconium fluoride, hexafluorosilicic acid, phosphate/fluoride, poly(vinyl phosphonic acid) (PVPA), vinyl phosphonic acid copolymer, poly(acrylic acid), or acrylic acid copolymer. Preferably, the grained and/or anodized aluminum support is then treated with poly(acrylic acid) using known procedures to improve surface hydrophilicity.

The thickness of the substrate can be varied but should be sufficient to sustain the wear from printing and thin enough to wrap around a printing form. Preferred embodiments include a treated aluminum foil having a thickness of from about 100 to about 600 μm.

The backside (non-imaging side) of the substrate may be coated with antistatic agents and/or slipping layers or a matte layer to improve handling and "feel" of the imageable element.

The substrate can also be a cylindrical surface having the radiation-sensitive composition applied thereon, and thus be an integral part of the printing press. The use of such imaged cylinders is described for example in U.S. Pat. No. 5,713,287 (Gelbart).

Positive-Working Imageable Elements:

For the positive-working imageable elements, the imageable layer comprises one or more of the solvent-resistant polymers (described above) and preferably one or more radiation absorbing compounds. While these compounds can be sensitive to any suitable energy form (for example, UV radiation), they are preferably sensitive to infrared radiation and thus, the radiation absorbing compounds are known as infrared radiation absorbing compounds ("IR absorbing compounds") that absorbs radiation from about 600 to about 1200 nm and preferably from about 700 to about 1200 nm.

The solvent-resistant polymer is generally present in the imageable layer in an amount of from about 1 to about 30 weight % and preferably from about 0.5 to about 20 weight % (based on total dry layer weight). The imageable layer is generally the outermost layer in the single-layer imageable element.

Examples of suitable IR dyes include but are not limited to, azo dyes, squarylium dyes, croconate dyes, triarylamine dyes, thioazolium dyes, indolium dyes, oxonol dyes, oxazolium dyes, cyanine dyes, merocyanine dyes, phthalocyanine dyes, indocyanine dyes, indotricarbocyanine dyes, hemicyanine dyes, streptocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo)-polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, polymethine dyes, squarine dyes, oxazole dyes, croconine dyes, porphyrin dyes, and any substituted or ionic form of the preceding dye classes. Suitable dyes are described for example, in U.S. Pat. No. 4,973,572 (DeBoer), U.S. Pat. No. 5,208,135 (Patel et al.), U.S. Pat. No. 5,244,771 (Jandrue Sr. et al.), and U.S. Pat. No. 5,401,618 (Chapman et al.), and EP 0 823 327A1 (Nagasaka et al.), all of which are incorporated herein by reference.

Cyanine dyes having an anionic chromophore are also useful. For example, the cyanine dye may have a chromophore having two heterocyclic groups. In another embodiment, the cyanine dye may have at least two sulfonic acid groups, more particularly two sulfonic acid groups and two indolenine groups. Useful IR-sensitive cyanine dyes of this type are described for example in U.S patent application Publication 2005-0130059 (Tao) that is incorporated by reference.

A general description of one class of suitable cyanine dyes is shown by the formula in paragraph 0026 of WO 2004/101280 (Munnelly et al.), incorporated herein by reference.

In addition to low molecular weight IR-absorbing dyes, IR dye moieties bonded to polymers can be used as well. Moreover, IR dye cations can be used as well, that is, the cation is the IR absorbing portion of the dye salt that ionically interacts with a polymer comprising carboxy, sulfo, phospho, or phosphono groups in the side chains.

Near infrared absorbing cyanine dyes are also useful and are described for example in U.S. Pat. No. 6,309,792 (Hauck et al.), U.S. Pat. No. 6,264,920 (Achilefu et al.), U.S. Pat. No. 6,153,356 (Urano et al.), U.S. Pat. No. 5,496,903 (Watanate et al.). Suitable dyes may be formed using conventional methods and starting materials or obtained from various commercial sources including American Dye Source (Baie D'Urfe, Quebec, Canada) and FEW Chemicals (Germany). Other useful dyes for near infrared diode laser beams are described, for example, in U.S. Pat. No. 4,973,572 (noted above).

Useful IR absorbing compounds include various pigments including carbon blacks such as carbon blacks that are surface-functionalized with solubilizing groups are well known in the art. Carbon blacks that are grafted to hydrophilic, nonionic polymers, such as FX-GE-003 (manufactured by Nippon Shokubai), or which are surface-functionalized with anionic groups, such as CAB-O-JET® 200 or CAB-O-JET® 300 (manufactured by the Cabot Corporation) are also useful. Other useful pigments include, but are not limited to, Heliogen Green, Nigrosine Base, iron (III) oxides, manganese oxide, Prussian Blue, and Paris Blue. The size of the pigment particles should not be more than the thickness of the imageable layer and preferably the pigment particle size will be less than half the thickness of the imageable layer.

The radiation absorbing compound can be present in the imageable element in an amount sufficient to render the imageable layer insoluble to an aqueous developer after exposure to appropriate radiation. This amount is generally at least 0.5% and up to 20 weight % and preferably from about 1 to about 10 weight % (based on total dry layer weight). Alternatively, the amount can be defined by an absorbance in the range of from about 0.05 to about 3, and preferably from about 0.1 to about 1.5, in the dry film as measured by reflectance UV-visible spectrophotometry. The particular amount needed for this purpose would be readily apparent to one skilled in the art, depending upon the specific compound used and the properties of the alkaline developer to be used.

Alternatively, the radiation absorbing compounds may be included in a separate layer that is in thermal contact with the imageable layer. Thus, during imaging, the action of the radiation absorbing compound can be transferred to the imageable layer without the compound originally being incorporated into it.

Preferably, the imageable layer includes one or more additional compounds that act as dissolution inhibitors that function as solubility-suppressing components for the alkali-soluble polymers. Dissolution inhibitors typically have polar functional groups that are believed to act as acceptor sites for hydrogen bonding with various groups in the polymeric binders. The acceptor sites comprise atoms with high electron density, preferably selected from electronegative first row elements such as carbon, nitrogen, and oxygen. Dissolution inhibitors that are soluble in the alkaline developer are preferred. Useful polar groups for dissolution inhibitors include but are not limited to, ether groups, amine groups, azo groups, nitro groups, ferrocenium groups, sulfoxide groups, sulfone groups, diazo groups, diazonium groups, keto groups, sulfonic acid ester groups, phosphate ester groups, triarylmethane groups, onium groups (such as sulfonium, iodonium, and phosphonium groups), groups in which a nitrogen atom is incorporated into a heterocyclic ring, and groups that contain a positively charged atom (such as quaternized ammonium group). Compounds that contain a positively-charged nitrogen atom useful as dissolution inhibitors include, for example, tetralkyl ammonium compounds and quaternized heterocyclic compounds such as quinolinium compounds, benzothiazolium compounds, pyridinium compounds, and imidazolium compounds. Further details and representative compounds useful as dissolution inhibitors are described for example in U.S. Pat. No. 6,294,311 (noted above). Particularly useful dissolution inhibitors include triarylmethane dyes such as ethyl violet, crystal violet, malachite green, brilliant green, Victoria blue B, Victoria blue R, and Victoria pure blue BO, BASONYL® Violet 610 and D11 (PCAS, Longjumeau, France). These compounds can also act as contrast dyes that distinguish the unimaged areas from the imaged areas in the developed imageable element.

When a dissolution inhibitor is present in the imageable layer, its amount can vary widely, but generally it is present in an amount of at least 0.5 weight % and up to 30 weight %, and preferably from about 1 to about 15 weight % (based on the total dry layer weight).

The imageable layer also preferably includes one or more binder resins, with or without polar groups, or a mixture of binder resins, some with polar groups and others without polar groups. The most suitable binder resins include phenolic resins such as novolak and resole resins, and such resins can also include one or more pendant diazo, carboxylate ester, phosphate ester, sulfonate ester, sulfinate ester, or ether groups. The hydroxy groups of the phenolic resins can be converted to -T-Z groups in which T represents a polar group and Z represents a non-diazide functional group as described for example in U.S. Pat. No. 6,218,083 (McCullough et al.) and WO 99/001795 (McCullough et al.). The hydroxy groups can also be derivatized with diazo groups containing o-naphthoquinone diazide moieties as described for example in U.S. Pat. No. 5,705,308 (West et al.) and U.S. Pat. No. 5,705,322 (West et al.).

These binder resins can be present in the imageable layer in an amount of from about 40 to about 90 weight %) and preferably at from about 55 to about 75 weight % (based on total layer dry weight).

The imageable layer can further include a variety of additives including dispersing agents, humectants, biocides, plasticizers, surfactants for coatability or other properties, viscosity builders, dyes or colorants to allow visualization of the written image, pH adjusters, drying agents, defoamers, preservatives, antioxidants, development aids, rheology modifiers or combinations thereof, or any other addenda commonly used in the lithographic art, in conventional amounts.

The positive-working single-layer imageable element can be prepared by applying the layer formulation(s) over the surface of the substrate (and any other hydrophilic layers provided thereon) using conventional coating or lamination methods. Thus, the formulations can be applied by dispersing or dissolving the desired ingredients in a suitable coating solvent, and the resulting formulations are sequentially or simultaneously applied to the substrate using suitable equipment and procedures, such as spin coating, knife coating, gravure coating, die coating, slot coating, bar coating, wire rod coating, roller coating, or extrusion hopper coating. The formulations can also be applied by spraying onto a suitable support (such as an on-press printing cylinder).

The coating weight for said single imageable layer is from about 0.5 to about 2.5 $g/m^2$ and preferably from about 1 to about 2 $g/m^2$.

The selection of solvents used to coat the layer formulation(s) depends upon the nature of the polymeric materials and other components in the formulations. Generally, the imageable layer formulation is coated out of acetone or another ketone, tetrahydrofuran, 1-methoxypropan-2-ol, 1-methoxy-2-propyl acetate, and mixtures thereof using conditions and techniques well known in the art.

Alternatively, the layer(s) may be applied by conventional extrusion coating methods from melt mixtures of the respective layer compositions. Typically, such melt mixtures contain no volatile organic solvents.

Intermediate drying steps may be used between applications of the various layer formulations to remove solvent(s) before coating other formulations. Drying steps may also help in preventing the mixing of the various layers.

Representative methods for preparing positive-working single-layer imageable elements of this invention are described below in Example 1.

Negative-Working Imageable Elements:

The negative-working imageable elements generally comprise, in order, a substrate, an imageable layer comprising specific negative-working chemistry, and optionally an overcoat layer.

Useful substrates are described above. A particularly useful substrate for negative-working imageable elements is either a) a brush-grained, phosphoric acid anodized, and poly(acrylic acid) treated substrate, or b) an electrochemically-grained, phosphoric acid anodized, and poly(acrylic acid) treated substrate.

The imageable layer comprising a negative-working imageable composition generally comprises at least one free-radical polymerizable compound, at least one radiation-absorbing compound, at least one solvent-resistant polymer as described above (in amounts described above), and a free-radical generating composition.

Useful free-radical polymerizable compounds include any compound that contains any polymerizable group that can be polymerized using free radical polymerization. For example, the polymerizable compounds can contain an addition polymerizable ethylenically unsaturated group, a crosslinkable ethylenically unsaturated group, a ring-opening polymerizable group, an azido group, an aryldiazonium salt group, an aryldiazosulfonate group, or combinations thereof. Preferably, the free-radical polymerizable compounds include ethylenically unsaturated free-radical polymerizable monomers, prepolymers, and oligomers, and free-radical crosslinkable polymers. Mixtures of such compounds can also be used. These compounds have at least one carbon—carbon double bond and are preferably multifunctional, that is with two or more unsaturated double bonds (more preferably, terminal unsaturated double bonds).

Typical multifunctional unsaturated free-radical polymerizable monomers and oligomers are described for example in Columns 5 and 6 of U.S. Pat. No. 6,893,797 (Munnelly et al.) that is incorporated by reference in its entirety. Particularly useful multifunctional monomers and oligomers preferably include unsaturated esters of alcohols, such as acrylate and methacrylate esters of polyols, multifunctional esters of acrylic or methacrylic acids such as di(meth) acrylates, tri(meth)acrylates, and penta(meth)acrylates.

Other suitable free-radical polymerizable compounds include urethane acrylates and methacrylates, epoxide acrylates and methacrylates, polyester acrylates and methacrylates, polyether acrylates and methacrylates, unsaturated polyester resins, unsaturated amides, vinyl esters, divinyl benzene, divinyl succinate, divinyl phthalate, and styrenic monomers.

The pentaerythritol tetracrylate and tetramethacrylate, dipentaerythritol pentacrylate and pentamethacrylate, di(trimethylol propane) tetraacrylate and tetramethacrylate, diethyleneglycol diacrylate and dimethacrylate, oligomeric urethanes acrylates and methacrylates are preferred free-radical polymerizable compounds used for this invention.

The imageable layer generally includes from about 35 to about 60 weight %, and preferably from about 45 to about 55 weight % of the free radical polymerizable compound, based on the total dry layer weight.

The imageable layer also includes one or more radiation absorbing compounds such as IR absorbing compounds described above. These compounds generally have maximum absorption wavelength of from about 750 nm to about 1200 nm and preferably from about 800 nm to about 1100 nm and preferably include cyanine dyes, triarylamine dyes, thiazolium dyes, polyaniline dyes, indolium dyes, oxazolium dyes, polypyrrole dyes, polythiophene dyes, and phthalocyanine dyes. The cyanine dyes described in Columns 6 through 8 of U.S. Pat. No. 6,893,797 (noted above) and Columns 5 through 10 of U.S. Pat. No. 6,309,792 (Hauck et al.), both reference being incorporated by reference in their entirety, are particularly useful in the negative-working imageable elements.

The free-radical generating composition can be any composition that generates free radicals upon exposure of the imageable layer. For example, this composition can include, but are not limited to: (a) triazines including polyhaloalkyl-substituted triazines such as trihalomethyl triazines as described in U.S. Pat. No. 4,997,745 (Kawamura et al.), (b) azinium compound, (c) polyhalogenated free-radical producing compounds, (d) the combination of a polyhaloalkyl-substituted free-radical producing compound and a carboxy-substituted carboaromatic compound as described for example in U.S. Pat. No. 6,893,797 (noted above), (e) the combination of an azinium compound and a carboxy-substituted carboaromatic compound as described for example in U.S. Pat. No. 6,309,792 (noted above), (f) benzoyl peroxide and hydroperoxides such as cumyl hydroperoxide, azo compounds such as azo bis-isobutyronitrile, 2,4,5-triarylimidazolyl dimers (hexaarylbisimidazoles) as described for example in U.S. Pat. No. 4,565,769 (Dueber et al.), (g) diaryliodonium salts and a photosensitizer, (h) borate and organoborate salts such as those described in U.S. Pat. No. 6,562,543 (Ogata et al.), and (i) onium salts. Other known initiator composition components are described for example in U.S patent application Publication 2003/0064318 (noted above), incorporated herein by reference.

Onium salts include but not limited to, a sulfonium, oxysulfoxonium, oxysulfonium, sulfoxonium, ammonium, selenonium, arsonium, phosphonium, diazonium, or halonium salt. Further details of useful onium salts, including representative examples, are provided in U.S. patent application Publication 2002/0068241 (Oohashi et al.), WO 2004/101280 (Munnelly et al.), and U.S. Pat. No. 5,086,086 (Brown-Wensley et al.), U.S. Pat. No. 5,965,319 (Kobayashi), and U.S. Pat. No. 6,051,366 (Baumann et al.), that are all incorporated herein by reference. For example, suitable phosphonium salts include positive-charged hypervalent phosphorus atoms with four organic substituents. Suitable sulfonium salts such as triphenylsulfonium salts include a positively-charged hypervalent sulfur with three organic substituents. Suitable diazonium salts possess a positive-charged azo group (that is —N═N+). Suitable ammonium salts include a positively-charged nitrogen atom such as substituted quaternary ammonium salts with four organic substituents, and quaternary nitrogen heterocyclic rings such as N-alkoxypyridinium salts. Suitable halonium salts include a positively-charged hypervalent halogen atom with two organic substituents. The onium salts generally include a suitable number of negatively-charged counterions such as halides, hexafluorophosphate, thiosulfate, hexafluoroantimonate, tetrafluoroborate, and others readily apparent to one skilled in the art.

In one embodiment, the onium salt has a positively-charged iodonium, (4-methylphenyl)[4-(2-methylpropyl) phenyl]-moiety and a suitable negatively charged counterion. A representative example of such an iodonium salt is available as Irgacure® 250 from Ciba Specialty Chemicals (Tarrytown, N.Y.) that is iodonium, (4-methylphenyl)[4-(2-methylpropyl)phenyl], hexafluorophosphate and is supplied in a 75% propylene carbonate solution.

Particularly useful triazines are the polyhaloalkyl-substituted triazines such as the compounds listed in Column 9, lines 15–22 of U.S. Pat. No. 6,893,797 (noted above). This reference also mentions other useful halogenated compounds such as tribromomethyl phenylsulfone and 1,2,3,4-tetrabromo-n-butane.

Azinium compounds are described for example in U.S. Pat. No. 6,309,792 (noted above) and include an azinium nucleus such as a pyridinium, diazinium, or triazinium nucleus. The azinium nucleus can also include one or more aromatic rings, typically carbocyclic aromatic rings, fused with an azinium ring, such as a quinolinium, isoquinolinium, benzodiazinium, or naphthodiazonium nuclei. The quaternizing substituent of the nitrogen ring in the azinium ring is capable of being released as a free radical.

Particularly useful free-radical generating compounds include triazines such as Triazine A and onium salts such as iodonium salts.

The free-radical generating composition is generally present in the imageable layer in an amount that will vary depending upon the combination of chemical reagents that are used. For example, combination (d) noted above is used, the polyhaloalkyl-substituted free radical producing compounds are generally present in an amount of from about 2 to about 15 weight % (preferably from about 4 to about 7 weight %), and the carboxy-substituted carboaromatic compound is generally present in an amount of from about 1 to about 10 weight % (preferably from about 1.5 to about 3 weight %), based on the total dry layer weight. If combination (e) noted above is used, the azinium compound is generally present in an amount of from about 2 to about 15 weight % (preferably from about 4 to about 7 weight %), and the carboxy-substituted carboaromatic compound is generally present in an amount of from about 1 to about 10 weight % (preferably from about 1.5 to about 3 weight %), based on the total dry layer weight. Other free-radical generating compounds can be present in conventional amounts of from about 1 to about 20 weight %.

The imageable layer can also include various optional components including but not limited to, dispersing aids, humectants, biocides, plasticizers, viscosity builders, printout dyes, pH adjusters, drying agents, defoamers, preservatives, antioxidants, development aids, rheology modifiers, contrast dyes, coating surfactants, or combinations thereof, in conventional amounts.

The imageable layer for the negative-working imageable elements generally has a dry coating weight of from about 0.5 to about 2 $g/m^2$ and preferably from about 1 to about 2 $g/m^2$.

The negative-working imageable elements can include an overcoat layer that is essentially oxygen-impermeable, soluble in an alkaline developer, and transparent to the imaging radiation. This overcoat layer can also protect the element from ablation during imaging and provide scratch resistance. Overcoat layers are described for example in U.S. Pat. No. 6,893,797 (noted above) and comprise water-soluble polymers that include but are not limited to, poly (vinyl alcohols) vinyl alcohol/vinyl acetate copolymers, poly(vinyl pyrrolidones), vinyl acetate/vinyl pyrrolidone copolymers, polyvinyl methyl ether, ring-opened copolymers of maleic anhydride and comonomers such as methyl vinyl ether, polyacrylic acid, gelatin and gelatin derivatives, cellulose ethers, and mixtures thereof. Polyvinyl alcohol is preferred.

The overcoat layer can also include coloring agents (such as water-soluble dyes) that do not absorb in the imaging region of the electromagnetic spectrum but efficiently absorb visible light, and adhesion promoters such as poly(vinyl imidazole) as described in WO 99/06890 (Pappas et al.).

The overcoat layer generally has a coating weight of from about 0.1 to about 6 $g/m^2$ and preferably from about 0.5 to about 4 $g/m^2$.

Representative methods for preparing the negative-working elements are described in Examples 4–6.

Multilayer Imageable Elements

In general, the multilayer imageable elements comprise a substrate, an inner layer (also known as an "underlayer"), and an outer layer (also known as a "top layer" or "topcoat") disposed over the inner layer. Before thermal imaging, the outer layer is not removable by an alkaline developer, but after thermal imaging, the imaged regions of the outer layer are removable by the alkaline developer. The inner layer is also removable by the alkaline developer. One or more solvent-resistant polymers (as described above) are generally present in the inner layer. An infrared radiation absorbing compound (defined below) is preferably present in the inner layer also and optionally additionally in a separate layer between the inner and outer layers.

The multi-layer imageable elements are formed by suitable application of an inner layer composition to a suitable substrate that is described in detail above in relation to the single-layer imageable elements of this invention. This substrate can be an untreated or uncoated support but it is usually treated or coated in various ways as described below prior to application of the inner layer composition. The substrate generally has a hydrophilic surface or at least a surface that is more hydrophilic than the outer layer composition. Grained and anodized aluminum sheets are preferred substrates.

An interlayer between the support and inner layer may be formed by treatment of the aluminum support with, for example, a silicate, dextrine, calcium zirconium fluoride, hexafluorosilicic acid, phosphate/fluoride, poly(vinyl phosphonic acid) (PVPA), vinyl phosphonic acid copolymer, poly(acrylic acid), or acrylic acid copolymer. Preferably, the grained and anodized aluminum support is treated with PVPA using known procedures to improve surface hydrophilicity.

The inner layer is disposed between the outer layer and the substrate. It is disposed over the substrate and, more typically, disposed directly on the substrate. The inner layer comprises one or more of the solvent-resistant polymers described above. These polymers are preferably insoluble in the solvent used to coat the outer layer so that the outer layer can be coated over the inner layer without dissolving the inner layer.

The inner layer may also comprise one or more primary additional polymeric materials, provided these primary additional polymeric materials do not adversely affect the chemical resistance and solubility properties of the inner layer. Preferred primary additional polymeric materials, when present, are novolak resins that may be added to improve the run length of the printing member when a post-development bake process is used.

Useful primary additional polymeric materials for the inner layer include polyvinyl acetals, (meth)acrylic resins comprising carboxy groups, vinyl acetate crotonate-vinyl neodecanoate copolymer phenolic resins, maleated wood rosins, styrene-maleic anhydride co-polymers, (meth)acrylamide polymers, polymers derived from an N-substituted cyclic imide, and combinations thereof. Polymeric materials that provide resistance both to fountain solution and aggressive washes are disclosed in U.S. Pat. No. 6,294,311 (noted above) that is incorporated herein by reference.

Particularly useful primary additional polymeric materials include polyvinyl acetals, and copolymers derived from an N-substituted cyclic imide (especially N-phenylmaleimide), a (meth)acrylamide (especially methacrylamide), and a (meth)acrylic acid (especially methacrylic acid). The preferred polymeric materials of this type are copolymers that comprise from about 20 to about 75 mol % and preferably about 35 to about 60 mol % or recurring units derived from N-phenylmaleimide, N-cyclohexylmaleimide, N-benzylmaleimide, or a mixture thereof, from about 10 to about 50 mol % and preferably from about 15 to about 40 mol % of recurring units derived from acrylamide, methacrylamide, or a mixture thereof, and from about 5 to about 30 mol % and preferably about 10 to about 30 mol % of recurring units derived from methacrylic acid. Other hydrophilic monomers, such as hydroxyethyl methacrylate, may be used in place of some or all of the methacrylamide. Other alkaline soluble monomers, such as acrylic acid, may be used in place of some or all of the methacrylic acid. Optionally, these polymers can also include recurring units derived from (meth)acrylonitrile or N-[2-(2-oxo-1-imidazolidinyl)ethyl] methacrylamide. These polymeric materials are soluble in a methyl lactate/methanol/dioxolane (15:42.5:42.5 wt. %) mixture that can be used as the coating solvent for the inner layer. However, they are poorly soluble in solvents such as acetone and toluene that can be used as solvents to coat the outer layer over the inner layer without dissolving the inner layer.

The inner layer may also comprise one or more secondary additional polymeric materials that are resins having activated methylol and/or activated alkylated methylol groups. Such resins include, for example resole resins and their alkylated analogs, methylol melamine resins and their alkylated analogs (for example melamine-formaldehyde resins), methylol glycoluril resins and alkylated analogs (for example, glycoluril-formaldehyde resins), thiourea-formaldehyde resins, guanamine-formaldehyde resins, and benzoguanamine-formaldehyde resins. Commercially available melamine-formaldehyde resins and glycoluril-formaldehyde resins include, for example, CYMEL® resins (Dyno Cyanamid) and NIKALAC® resins (Sanwa Chemical).

The resin having activated methylol and/or activated alkylated methylol groups is preferably a resole resin or a mixture of resole resins. Resole resins are well known to those skilled in the art. They are prepared by reaction of a phenol with an aldehyde under basic conditions using an excess of phenol. Commercially available resole resins include, for example, GP649D99 resole (Georgia Pacific).

Other useful primary additional polymeric materials include copolymers that comprises from about 1 to about 30 mole % and preferably from about 3 to about 20 mole % of recurring units derived from N-phenylmaleimide, from about 1 to about 30 mole % and preferably from about 5 to about 20 mole % of recurring units derived from methacrylamide, from about 20 to about 75 mole % and preferably from about 35 to about 60 mole % of recurring units derived from acrylonitrile, and from about 20>to about 75 mole % and preferably from about 35 to about 60 mole % of recurring units derived from one or more monomers of the following Structure (VIII):

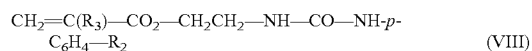

$$CH_2{=}C(R_3){-}CO_2{-}CH_2CH_2{-}NH{-}CO{-}NH\text{-}p\text{-}C_6H_4{-}R_2 \quad \text{(VIII)}$$

wherein $R_2$ is OH, COOH, or $SO_2NH_2$, and $R_3$ is H or methyl, and, optionally, from about 1 to about 30 mole % and preferably, when present, from about 3 to about 20 mole % of recurring units derived from one or more monomers of the following Structure (IX):

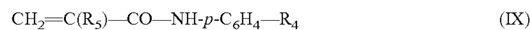

$$CH_2{=}C(R_5){-}CO{-}NH\text{-}p\text{-}C_6H_4{-}R_4 \quad \text{(IX)}$$

wherein $R_4$ is OH, COOH, or $SO_2NH_2$, and $R_5$ is H or methyl.

Other useful secondary additional polymeric materials can include copolymers that comprise from about 25 to about 75 mole % and about 35 to about 60 mole % of recurring units derived from N-phenylmaleimide, from about 10 to about 50 mole % and preferably from about 15 to about 40 mole % of recurring units derived from methacrylamide, and from about 5 to about 30 mole % and preferably from about 10 to about 30 mole % or recurring units derived from methacrylic acid. These secondary additional copolymers are disclosed in U.S. Pat. Nos. 6,294,311 and 6,528,228 (both noted above).

The primary and secondary additional polymeric materials useful in the inner layer can be prepared by methods, such as free radical polymerization, that are well known to those skilled in the art and that are described, for example, in Chapters 20 and 21, of *Macromolecules*, Vol. 2, 2nd Ed., H. G. Elias, Plenum, N.Y., 1984. Useful free radical initiators are peroxides such as benzoyl peroxide, hydroperoxides such as cumyl hydroperoxide and azo compounds such as 2,2'-azobis(isobutyronitrile) (AIBN). Suitable reaction solvents include liquids that are inert to the reactants and that will not otherwise adversely affect the reaction.

In preferred embodiments, the inner layer further comprises an infrared radiation absorbing compound ("IR absorbing compounds") that absorbs radiation at from about 600 to about 1200 and preferably at from about 700 to about 1200 nm, with minimal absorption at from about 300 to about 600 nm. This compound (sometimes known as a "photothermal conversion material") absorbs radiation and converts it to heat. Although one of the polymeric materials may itself comprise an IR absorbing moiety, typically the infrared radiation absorbing compound is a separate compound. This compound may be either a dye or pigment (including carbon blacks). Examples of useful carbon blacks are ProJet 900, ProJet 860 and ProJet 830 (all available from the Zeneca Corporation). Useful pigments (including carbon blacks) and particularly useful IR absorbing dyes ("IR dyes") are described above in the description of the single-layer imageable elements.

The radiation absorbing compound can be present in multilayer imageable elements in an amount of generally at least 8% and up to 30% and preferably from about 8 to about 25%, based on the total inner layer dry weight. The particular amount of a given IR absorbing compound to be used could be readily determined by one skilled in the art.

The inner layer can include other components such as surfactants, dispersing aids, humectants, biocides, viscosity builders, drying agents, defoamers, preservatives, antioxidants, and colorants.

The inner layer generally has a dry coating coverage of from about 0.5 to about 2.5 g/m$^2$ and preferably from about 1 to about 2 g/m$^2$. The polymeric materials described above generally comprise at least 50 weight % and preferably from about 60 to about 90 weight % based on the total dry layer weight, and this amount can be varied depending upon what other polymers and chemical components are present. Any primary and secondary additional polymeric materials (such as a novolak, resole, or copolymers noted above) can be present in an amount of from about 5 to about 45 weight % and preferably from about 5 to about 25 weight % based on the total dry weight of the inner layer.

The outer layer of the imageable element is disposed over the inner layer and in preferred embodiments there are no intermediate layers between the inner and outer layers. The outer layer comprises a polymeric material that is a light-stable, water-insoluble, alkaline developer soluble, film-forming binder material such as phenolic resins, urethane resins, and polyacrylates. The outer layer is generally substantially free of infrared radiation absorbing compounds, meaning that none of these compounds are purposely incorporated therein and insubstantial amounts diffuse into it from other layers. Particularly useful binder materials are described, for example in U.S. Pat. No. 6,352,812 (noted above), U.S. Pat. No. 6,358,669 (noted above), U.S. Pat. No. 6,352,811 (noted above), U.S. Pat. No. 6,294,311 (noted above), U.S. Pat. No. 6,893,783 (Kitson et al.), and U.S. Pat. No. 6,645,689 (Jarek), U.S. patent application Publications 2003/0108817 (Patel et al) and 2003/0162,126 (Kitson et al.), and WO 2005/018934 (Kitson et al.), all of which are incorporated herein by reference.

Particularly useful film-forming binder materials for the outer layer are phenolic resins or hydroxy-containing polymers containing phenolic monomeric units that can be random, alternating, block, or graft copolymers of different monomers and may be selected from polymers of vinyl phenol, novolak resins, or resole resins. Novolak resins are preferred. The novolak or resole resins can be prepared using conventional starting materials (a hydroxy aromatic hydrocarbon and an aldehydes or ketone) and reaction conditions. The weight average molecular weight ($M_w$), measured using gel permeation chromatography using standard calibration and polystyrene standards, of the novolak resins is from about 500 to about 150,000 g/mol, and more preferably from about 1,500 to about 15,000 g/mol.

Useful poly(vinyl phenol) resins can be polymers of one or more hydroxyphenyl containing monomers such as hydroxystyrenes and hydroxyphenyl (meth)acrylates. Other monomers not containing hydroxy groups can be copolymerized with the hydroxy-containing monomers. These resins can be prepared by polymerizing one or more of the monomers in the presence of a radical initiator or a cationic polymerization initiator using known reaction conditions. The weight average molecular weight ($M_w$) of these polymers, measured as described above for the novolak resins, of the novolak resins is from about 1000 to about 200,000 g/mol, and more preferably from about 1,500 to about 50,000 g/mol.

Examples of useful hydroxy-containing polymers include ALNOVOL SPN452, SPN400, HPN100 (Clariant GmbH), DURITE PD443, SD423A, SD126A (Borden Chemical, Inc.), BAKELITE 6866LB02, AG, 6866LB03 (Bakelite AG), KR 400/8 (Koyo Chemicals Inc.), HRJ 1085 and 2606 (Schenectady International, Inc.), and Lyncur CMM (Siber Hegner), all of which are described in U.S. patent application Publication 2005/0037280 (noted above). A particularly useful polymer that can be modified as described above is PD-140 described for the Examples below.

It is also possible to include in the outer layer one or more “modified” phenolic resin binders that comprise phenolic recurring units that are substituted by the group represented by Structure (Q) shown as follows:

(Q)

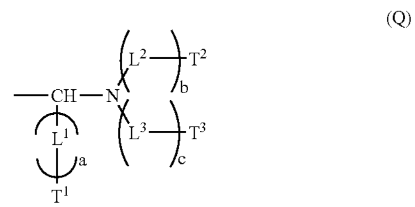

wherein $L^1$, $L^2$, and $L^3$ independently represent linking groups, $T^1$, $T^2$, and $T^3$ independently represent terminal groups, and a, b, and c are independently 0 or 1.

More particularly, each of $L^1$, $L^2$, and $L^3$ are independently a substituted or unsubstituted alkylene having 1 to 4 carbon atoms (such as methylene, 1,2-ethylene, 1,1-ethylene, n-propylene, iso-propylene, t-butylene, and n-butylene groups), substituted cycloalkylene having 5 to 7 carbon atoms in the cyclic ring (such as cyclopentylene and 1,4-cyclohexylene), substituted or unsubstituted arylene having 6 to 10 carbon atoms in the aromatic ring (such as 1,4-phenylene, naphthylene, 2-methyl-1,4-phenylene, and 4-chloro-1,3-phenylene groups), or substituted or unsubstituted, aromatic or non-aromatic divalent heterocyclic group having 5 to 10 carbon and one or more heteroatoms (nitrogen, oxygen, or sulfur atoms) in the cyclic ring (such as pyridylene, pyrazylene, pyrimidylene, or thiazolylene groups), or any combinations of two or more of these divalent linking groups. Alternatively, $L^2$ and $L^3$ together can represent the necessary atoms to form a carbocyclic or heterocyclic ring structure. Preferably, $L^1$ is a carbon-hydrogen single bond or a methylene, ethylene, or phenylene group, and $L^2$ and $L^3$ are independently hydrogen, methyl, ethyl, 2-hydroxyethyl, or cyclic —$(CH_2)_2O(CH_2CH_2)$— groups.

$T^1$, $T^2$, and $T^3$ are independently terminal groups such as hydrogen, or substituted or unsubstituted alkyl groups having 1 to 10 carbon atoms (such as methyl, ethyl, iso-propyl, 1-butyl, n-hexyl, methoxymethyl, phenylmethyl, hydroxyethyl, and chloroethyl groups), substituted or unsubstituted alkenyl groups having 2 to 10 carbon atoms (such as ethenyl and hexenyl groups), substituted or unsubstituted alkynyl groups (such as ethynyl and octynyl groups), substituted or unsubstituted cycloalkyl groups having 5 to 7 carbon atoms in the cyclic ring (such as cyclopentyl, cyclohexyl, and cycloheptyl groups), substituted or unsubstituted heterocyclic groups (both aromatic and non-aromatic) having a carbon atom and one or more heteroatoms in the ring (such as pyridyl, pyrazyl, pyrimidyl, thiazolyl, and indolyl groups), and substituted or unsubstituted aryl groups having 6 to 10 carbon atoms in the aromatic ring (such as phenyl, naphthyl, 3-methoxyphenyl, benzyl, and 4-bromophenyl groups). Alternatively, $T^2$ and $T^3$ together represent the atoms necessary to form a cyclic structure that can also contain fused rings.

In addition, when a is 0, $T^3$ is not hydrogen.

The $L^1$, $L^2$, $L^3$, $T^1$, $T^2$, and $T^3$ groups defined above can be substituted with one or more substituents such as —$OR^{11}$, —$SR^{11}$, —CO—$OR^{11}$, —$OCOR^{11}$, —$COR^{11}$, —$SO_2R^{11}$, —$SO_2R^{11}$, cyano, nitro, halo, phosphate, phosphonate, amino, amido, imido, sulfonamido groups wherein $R^{11}$ is defined similarly to $T^1$–$T^3$ noted above.

Preferably, a is 0 and b and c are each 1. More preferably, a is 0 and $T^1$ is hydrogen. In another more preferred embodiment, $T^2$ and/or $T^3$ comprise a 5- to 6-membered heteroaromatic group.

This modified phenolic resin binder can be prepared by the reaction of a phenolic monomeric unit with a first compound comprising an aldehyde group and a second compound comprising an amine group. Useful first compounds are listed as Compounds AL-01 to AL-20 in U.S. patent application Publication 2005/0037280 (noted above), incorporated herein by reference. In preferred embodiments, the first compound is formaldehyde, propionaldehyde, or benzaldehyde.

Useful amine compounds are linear or cyclic primary or secondary amines such as those described as Compounds AM-01 to AM-27 in U.S. patent application Publication 2005/0037280 (noted above). Preferred amine compounds include morpholine, ethanolamine, and benzylamine.

The modified phenolic resin binder can contain more than one type of substituted Structure (Q) group. The different Structure (Q) groups can be incorporated successively or as a mixture of different first and second compounds in the reaction with the hydroxy-containing polymer. The amount and type of Structure (Q) group is limited only by the solubility of the resulting modified phenolic resin binder in the alkaline developer. If present in the outer layer, generally at least 0.5 mol % and up to 50 mol % of the modified phenolic resin binder recurring units comprise the same or different Structure (Q) groups. Preferably, the Structure (Q) groups are present in from about 1 to about 40 mol %.

The Structure (Q) group described above is the predominant substituent in the modified phenolic resin binders. However, some of the Structure (Q) groups in the polymer chain may be present in quaternized form, for example, as a result of reaction with a strong acid such as sulfuric acid or hydrochloric acid or with an alkyl halide.

While the modified phenolic resin binders can be the only binder materials in the outer layer, it is also preferable to include in the outer layer a mixture of one or more (unmodified) phenolic resin binders that do not include Structure (Q) groups with one or more modified phenolic resin binders described having Structure (Q) groups. The amounts of the various binder materials can be readily optimized to provide the desired properties in the resulting imageable element.

The outer layer can also include non-phenolic polymeric materials as film-forming binder materials in addition to or instead of the phenolic resins described above. Such non-phenolic polymeric materials include polymers formed from maleic anhydride and one or more styrenic monomers (that is styrene and styrene derivatives having various substituents on the benzene ring), polymers formed from methyl methacrylate and one or more carboxy-containing monomers, and mixtures thereof. These polymers can comprises recurring units derived from the noted monomers as well as recurring units derived from additional, but optional monomers [such as (meth)acrylates, (meth)acrylonitrile and (meth)acrylamides].

The polymers derived from maleic anhydride generally comprise from about 1 to about 50 mol % of recurring units derived from maleic anhydride and the remainder of the recurring units derived from the styrenic monomers and optionally additional polymerizable monomers.

The polymer formed from methyl methacrylate and carboxy-containing monomers generally comprise from about 80 to about 98 mol % of recurring units derived from methyl methacrylate. The carboxy-containing recurring units can be derived, for example, from acrylic acid, methacrylic acid, itaconic acid, maleic acid, and similar monomers known in the art.

In some, but not all, embodiments, the outer layer further includes a monomeric or polymeric compound that includes a benzoquinone diazide and/or naphthoquinone diazide moiety. The polymeric compounds can be phenolic resins derivatized with a benzoquinone diazide and/or naphthoquinone diazide moiety as described for example in U.S. Pat. No. 5,705,308 (West et al.) and U.S. Pat. No. 5,705,322 (West et al.) that are incorporated by reference. Mixtures of such compounds can also be used. An example of a useful polymeric compound of this type is P-3000, a naphthoquinone diazide of a pyrogallol/acetone resin (available from PCAS, France). Other useful compounds containing diazide moieties are described for example in U.S. Pat. No. 6,294,311 (noted above) and U.S. Pat. No. 5,143,816 (Mizutani et al.) that are incorporated by reference.

The monomeric or polymeric compound having a benzoquinone and/or naphthoquinone diazide moiety can be present in the outer layer generally in an amount of at least 5%, and preferably from about 10 to about 50%, based on total dry weight of the outer layer.

The outer layer can optionally include additional compounds that are colorants that may function as solubility-suppressing components for the alkali-soluble polymers. These colorants typically have polar functional groups that are believed to act as acceptor sites for hydrogen bonding with various groups in the polymeric binders. Colorants that are soluble in the alkaline developer are preferred. Useful polar groups include but are not limited to, diazo groups, diazonium groups, keto groups, sulfonic acid ester groups, phosphate ester groups, triarylmethane groups, onium groups (such as sulfonium, iodonium, and phosphonium groups), groups in which a nitrogen atom is incorporated into a heterocyclic ring, and groups that contain a positively charged atom (such as quaternized ammonium group). Further details and representative colorants are described for example in U.S. Pat. No. 6,294,311 (noted above). Particularly useful colorants include triarylmethane dyes such as ethyl violet, crystal violet, malachite green, brilliant green, Victoria blue B, Victoria blue R, and Victoria pure blue BO. These compounds can act as contrast dyes that distinguish the unimaged areas from the imaged areas in the developed imageable element.

When a colorant is present in the outer layer, its amount can vary widely, but generally it is present in an amount of at least 0.1% and up to 30%, and preferably from about 0.5 to about 15%, based on the total dry weight of the outer layer.

The outer layer can optionally also include printout dyes, surfactants, dispersing aids, humectants, biocides, viscosity builders, drying agents, defoamers, preservatives, and antioxidants.

The outer layer generally has a dry coating coverage of from about 0.2 to about 1 $g/m^2$ and preferably from about 0.4 to about 0.7 $g/m^2$.

Although not preferred, there may be a separate layer that is in between and in contact with the inner and outer layers. This separate layer can act as a barrier to minimize migration of radiation absorbing compound(s) from the inner layer to the outer layer. This separate "barrier" layer generally comprises a polymeric material that is soluble in the alkaline developer. If this polymeric material is different from the polymeric material(s) in the inner layer, it is preferably soluble in at least one organic solvent in which the inner layer polymeric materials are insoluble. A preferred polymeric material of this type is a poly(vinyl alcohol). Generally, this barrier layer should be less than one-fifth as thick as the inner layer, and preferably less than one-tenth as thick as the inner layer.

The imageable element can be prepared by sequentially applying an inner layer formulation over the surface of the substrate (and any other hydrophilic layers provided thereon), and then applying an outer layer formulation over the inner layer using conventional coating or lamination methods. It is important to avoid intermixing the inner and outer layer formulations.

The inner and outer layers can be applied by dispersing or dissolving the desired ingredients in a suitable coating solvent, and the resulting formulations are sequentially or simultaneously applied to the substrate using suitable equipment and procedures, such as spin coating, knife coating, gravure coating, die coating, slot coating, bar coating, wire rod coating, roller coating, or extrusion hopper coating. The formulations can also be applied by spraying onto a suitable support (such as an on-press printing cylinder).

The selection of solvents used to coat both the inner and outer layers depends upon the nature of the polymeric materials and other components in the formulations. To prevent the inner and outer layer formulations from mixing or the inner layer from dissolving when the outer layer formulation is applied, the outer layer formulation should be coated from a solvent in which the polymeric materials of the inner layer are insoluble. Generally, the inner layer formulation is coated out of a solvent mixture of methyl ethyl ketone (MEK), 1-methoxypropan-2-ol, γ-butyrolactone, and water, a mixture of diethyl ketone (DEK), water, methyl lactate, and γ-butyrolactone, or a mixture of DEK, water, and methyl lactate. The outer layer formulation is generally coated out of DEK or a mixture of DEK and 1-methoxy-2-propyl acetate.

Alternatively, the inner and outer layers may be applied by conventional extrusion coating methods from melt mixtures of the respective layer compositions. Typically, such melt mixtures contain no volatile organic solvents.

Intermediate drying steps may be used between applications of the various layer formulations to remove solvent(s) before coating other formulations. Drying steps may also help in preventing the mixing of the various layers.

Representative methods for preparing multi-layer imageable elements of this invention are described below in Examples 2 and 3.

Imaging Conditions

The single-layer and multi-layer imageable elements of this invention can have any useful form including, but not limited to, printing plate precursors, printing cylinders, printing sleeves and printing tapes (including flexible printing webs). Preferably, the imageable members are printing plate precursors.

Printing plate precursors can be of any useful size and shape (for example, square or rectangular) having the requisite imageable layer disposed on a suitable substrate. Printing cylinders and sleeves are known as rotary printing members having the substrate and imageable layer in a cylindrical form. Hollow or solid metal cores can be used as substrates for printing sleeves.

During use, the single-layer and multi-layer imageable elements are exposed to a suitable source of radiation such as UV, visible light, or infrared radiation, depending upon the radiation absorbing compound present in the radiation-sensitive composition, at a wavelength of from about 300 to about 1400 nm. Preferably, imaging is carried out using an infrared laser at a wavelength of from about 700 to about 1200 nm. The laser used to expose the imaging member is preferably a diode laser, because of the reliability and low maintenance of diode laser systems, but other lasers such as gas or solid state lasers may also be used. The combination of power, intensity and exposure time for laser imaging would be readily apparent to one skilled in the art. Presently, high performance lasers or laser diodes used in commercially available imagesetters emit infrared radiation at a wavelength of from about 800 to about 850 nm or from about 1060 to about 1120 nm.

The imaging apparatus can function solely as a platesetter or it can be incorporated directly into a lithographic printing press. In the latter case, printing may commence immediately after imaging, thereby reducing press set-up time considerably. The imaging apparatus can be configured as a flatbed recorder or as a drum recorder, with the imageable member mounted to the interior or exterior cylindrical surface of the drum. A useful imaging apparatus is available as models of Creo Trendsetter® imagesetters available from Eastman Kodak Company (Burnaby, British Columbia, Canada) that contain laser diodes that emit near infrared radiation at a wavelength of about 830 nm. Other suitable imaging sources include the Crescent 42T Platesetter that operates at a wavelength of 1064 nm (available from Gerber Scientific, Chicago, Ill.) and the Screen PlateRite 4300 series or 8600 series platesetter (available from Screen, Chicago, Ill.). Additional useful sources of radiation include direct imaging presses that can be used to image an element while it is attached to the printing plate cylinder. An example of a suitable direct imaging printing press includes the Heidelberg SM74-DI press (available from Heidelberg, Dayton, Ohio).

Imaging speeds may be in the range of from about 50 to about 1500 mJ/cm$^2$, and more particularly from about 75 to about 400 mJ/cm$^2$.

While laser imaging is preferred in the practice of this invention, imaging can be provided by any other means that provides thermal energy in an imagewise fashion. For example, imaging can be accomplished using a thermoresistive head (thermal printing head) in what is known as "thermal printing", described for example in U.S. Pat. No. 5,488,025 (Martin et al.). Thermal print heads are commercially available (for example, as Fujitsu Thermal Head FTP-040 MCS001 and TDK Thermal Head F415 HH7-1089).

Imaging is generally carried out by direct digital imaging. The image signals are stored as a bitmap data file on a computer. Such files may be generated by a raster image processor (RIP) or other suitable means. The bitmaps are constructed to define the hue of the color as well as screen frequencies and angles.

Imaging of the imageable element produces an imaged element that comprises a latent image of imaged (exposed) and non-imaged (non-exposed) regions. Developing the imaged element with a suitable alkaline developer removes the exposed regions of the outermost layer and the layers (including the inner layer) underneath it, and exposing the hydrophilic surface of the substrate. Thus, such imageable elements are "positive-working" (for example, "positive-working" lithographic printing plate precursors). The exposed (or imaged) regions of the hydrophilic surface repel ink while the unexposed (or non-imaged) regions of the outer layer accept ink.

When the unexposed (or non-imaged) regions are removed and the exposed (imaged) regions remain, the imageable elements are "negative-working".

More particularly for positive-working elements, development is carried out for a time sufficient to remove the imaged (exposed) regions of the outer layer and underlying layers, but not long enough to remove the non-imaged (non-exposed) regions of the outer layer. Thus, the imaged (exposed) regions of the outer layer are described as being "soluble" or "removable" in the alkaline developer because they are removed, dissolved, or dispersed within the alkaline developer more readily than the non-imaged (non-exposed) regions of the outer layer. Thus, the term "soluble" also means "dispersible".

The imaged elements are generally developed using conventional processing conditions. Both aqueous alkaline developers and solvent-based alkaline developers can be used with the latter type of alkaline developers being preferred.

Aqueous alkaline developers generally have a pH of at least 7 and preferably of at least 11. The higher pH developers are generally best for processing the single-layer elements. Useful alkaline aqueous developers include 3000 Developer, 9000 Developer, GOLDSTAR Developer, GREENSTAR Developer, ThermalPro Developer, PROTHERM Developer, MX1813 Developer, and MX1710 Developer (all available from Kodak Polychrome Graphics a subsidiary of Eastman Kodak Company). These compositions also generally include surfactants, chelating agents (such as salts of ethylenediaminetetraacetic acid), and alkaline components (such as inorganic metasilicates, organic metasilicates, hydroxides, and bicarbonates).

Solvent-based alkaline developers are generally single-phase solutions of one or more organic solvents that are miscible with water. Useful organic solvents the reaction products of phenol with ethylene oxide and propylene oxide [such as ethylene glycol phenyl ether (phenoxyethanol)], benzyl alcohol, esters of ethylene glycol and of propylene glycol with acids having 6 or less carbon atoms, and ethers of ethylene glycol, diethylene glycol, and of propylene glycol with alkyl groups having 6 or less carbon atoms, such as 2-ethylethanol and 2-butoxyethanol. The organic solvent(s) is generally present in an amount of from about 0.5 to about 15% based on total developer weight.

Representative solvent-based alkaline developers include ND-1 Developer, 955 Developer and 956 Developer (available from Kodak Polychrome Graphics a subsidiary of Eastman Kodak Company).

Generally, the alkaline developer is applied to the imaged element by rubbing or wiping the outer layer with an applicator containing the developer. Alternatively, the imaged element can be brushed with the developer or the developer may be applied by spraying the outer layer with sufficient force to remove the exposed regions. Still again, the imaged element can be immersed in the developer. In all instances, a developed image is produced in a lithographic printing plate having excellent resistance to press room chemicals.

Following development, the imaged element can be rinsed with water and dried in a suitable fashion. The dried element can also be treated with a conventional gumming solution (preferably gum arabic).

The imaged and developed element can also be baked in a postbake operation that can be carried out to increase run length of the resulting imaged element. Baking can be carried out, for example at from about 220° C. to about 240° C. for from about 7 to about 10 minutes, or at about 120° C. for 30 minutes.

Printing can be carried out by applying a lithographic ink and fountain solution to the printing surface of the imaged element. The ink is taken up by the non-imaged (non-exposed or non-removed) regions of the outer layer and the fountain solution is taken up by the hydrophilic surface of the substrate revealed by the imaging and development process. The ink is then transferred to a suitable receiving material (such as cloth, paper, metal, glass, or plastic) to provide a desired impression of the image thereon. If desired, an intermediate "blanket" roller can be used to transfer the ink from the imaged member to the receiving material. The imaged members can be cleaned between impressions, if desired, using conventional cleaning means and chemicals.

The following examples are provided to illustrate the practice of the invention but are by no means intended to limit the invention in any manner.

The components and materials used in the examples and analytical methods were as follows:

MEK is methyl ethyl ketone.

DEK is diethyl ketone.

DAA is diacetone alcohol.

BLO is γ-butyrolactone.

BC is 2-Butoxyethanol (Butyl CELLOSOLVE®).

PGME is 1-methoxypropan-2-ol (or Dowanol PM).

956 Developer is an organic solvent-based (phenoxyethanol) alkaline developer (Kodak Polychrome Graphics, Norwalk, Conn., USA, a subsidiary of Eastman Kodak Company).

Goldstar Plus Developer is a metasilicates-containing developer available from Kodak Polychrome Graphics.

IR Dye A was obtained from Eastman Kodak Company and is represented by the following formula:

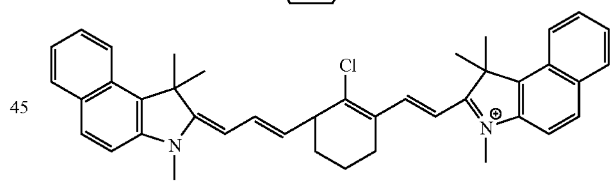

IR Dye A

IR Dye B is represented by the following formula:

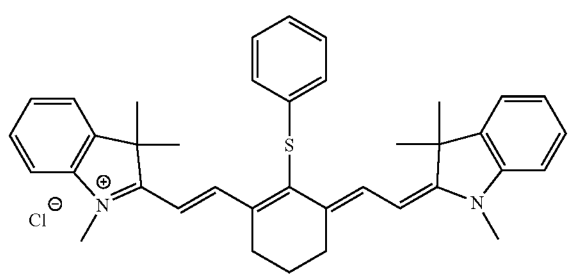

IR Dye B

Ethyl violet is C.I. 42600 (CAS 2390-59-2, $\lambda_{max}$=596 nm) having a formula of (p-$(CH_3CH_2)_2NC_6H_4)_3C^+Cl^-$ (Aldrich Chemical Company, Milwaukee, Wis., USA).

Basonyl violet is Basic Violet 3, $\lambda_{max}$ at 588 nm (Aldrich Chemical Co.).

P3000 is the reaction product of 1,2-naphthaquinone-5-sulfonyl chloride with pyrogallol acetone condensate (PCAS, Longjumeau, France).

PD-140 is a cresol/formaldehyde novolac resin (75:25 m-cresol/-p-cresol) (Borden Chemical, Columbus, Ohio, USA).

LB 6564 is a phenol/cresol novolac resin (from Rutgers-Plenco LLC, Sheboygan, Wis.).

PD 494 is an m/p-cresol novolac resin (from Borden Chemical).

Durez 33816 is a cresylic novolac resin (from Durez-Sumitomo, Grand Island, N.Y.).

Byk® 307 is a polyethoxylated dimethylpolysiloxane copolymer that is available from Byk Chemie (Wallingford, Conn.) in a 25 wt. % xylene/methoxypropyl acetate solution.

XDSA is 4,6-dimethyl-N,N'-diphenyl-1,3-benzenedisulfonamide.

KP654b is a 2-[2-[2-chloro-3-[(1,3-dihydro-1,3,3-trimethyl-2H-indol-2-ylidene)ethylidene]-1-cyclohexen-1-yl] ethenyl]-1,3,3-trimethyl-3H-Indolium bromide (from Honeywell Specialty Chemicals, Morristown, N.J.).

Silikophen P50X is a phenylmethyl polysiloxane (from Tego Chemie Service, Essen, Germany).

The following polymers were prepared and used in the Examples below:

Synthesis of Polymer A:

2,2'-Azobis(isobutyronitrile) (AIBN, 0.2 g), N-phenylmaleimide (PMI, 6 g)), acrylonitrile (8 g), methacrylamide (3 g), ethylene glycol methacrylate phosphate (3 g), and N,N-dimethylacetamide (DMAC, 80 g) were placed in a 250-ml 3-necked flask, equipped with magnetic stirring, temperature controller and $N_2$ inlet. The mixture was heated to 60° C. and stirred under $N_2$ protection for 6 hours. After standing at room temperature for about 72 hours, AIBN (0.1 g) was added and the reaction mixture was heated back to 60° C. and stirred for another 5 hours. The reaction solution was slowly dropped into n-propanol (400 ml) and a precipitate was formed. Filtering and washing was carried out with another 200 ml of n-propanol. After filtration and drying at below 50° C., 18.0 g of sticky solid (Polymer A) was obtained, which solid was dissolved in 82 g of DMAC for future use.

Synthesis of Polymer B:

AIBN (0.4 g), PMI (16 g), acrylonitrile (20 g), ethylene glycol methacrylate phosphate (4 g), and DMAC (80 g) were placed in a 250-ml 3-necked flask, equipped with magnetic stirring, temperature controller and $N_2$ inlet. The mixture was heated to 60° C. and stirred under $N_2$ protection for 6 hours after which AIBN (0.1 g) was added and the reaction was continued overnight. The reaction mixture contained 27% of Polymer B that was directly used in coating formulations.

Synthesis of Polymer C-1 (Non-Powder):

AIBN (0.25 g), PMI (6 g), acrylonitrile (9.6 g), methacrylic acid (2.4 g), ethylene glycol methacrylate phosphate (2 g), and DMAC (80 g) were placed in a 250-ml 3-necked flask, equipped with magnetic stirring, temperature controller and $N_2$ inlet. The mixture was heated to 60° C. and stirred under $N_2$ protection for 6 hours, after which AIBN (0.1 g) was added and the reaction was continued overnight. The reaction mixture contained 18% of Polymer C-1 and was directly used in coating formulations.

Synthesis of Polymer C-2 (Powder):

AIBN (0.75 g), PMI (18 g), acrylonitrile (28.8 g), methacrylic acid (7.2 g), ethylene glycol methacrylate phosphate (6 g), and DMAC (240 g) were placed in a 500-ml 3-necked flask, equipped with magnetic stirring, temperature controller and $N_2$ inlet. The mixture was heated to 60° C. and stirred under $N_2$ protection for 6 hours after which AIBN (0.2 g) was added and the reaction was continued overnight. The reaction mixture contained 20% of Polymer C and was slowly dropped into 2000 ml of n-propanol and a precipitate was formed. Filtering and washing was carried out with another 400 ml of n-propanol. After filtration and drying at below 50° C., 31 g of solid Polymer C-2 was obtained.

Synthesis of Polymer D:

AIBN (0.4 g), PMI (12 g), acrylonitrile (24 g), ethylene glycol methacrylate phosphate (4 g), and DMAC (80 g) were placed in a 250-ml 3-necked flask, equipped with magnetic stirring, temperature controller and $N_2$ inlet. The mixture was heated to 60° C. and stirred under $N_2$ protection for 6 hours, after which AIBN (0.1 g) was added and the reaction was continued overnight. The reaction mixture contained 26% of Polymer D and was directly used in the coating formulations.

Synthesis of Polymer E:

AIBN (0.5 g), PMI (22.5 g), methacrylamide (3 g), ethylene glycol methacrylate phosphate (4.5 g), and DMAC (70 g) were placed in a 250-ml 3-necked flask, equipped with magnetic stirring, temperature controller and $N_2$ inlet. The mixture was heated to 60° C. and stirred under $N_2$ protection overnight. The reaction mixture contained 30% of Polymer E and was directly used in coating formulations.

Synthesis of Polymer F:

AIBN (0.4 g), PMI (10.5 g), acrylonitrile (15 g), ethylene glycol methacrylate phosphate (4.5 g), and DMAC (70 g) were placed in a 250-ml 3-necked flask, equipped with magnetic stirring, temperature controller and $N_2$ inlet. The mixture was heated to 60° C. and stirred under $N_2$ protection for 6 hours after which AIBN (0.1 g) was added and the reaction was continued overnight. The reaction mixture contained 30% of Polymer F and was directly used in coating formulations.

Synthesis of Polymer G:

AIBN (0.25 g), PMI (6 g), acrylonitrile (9.6 g), methacrylamide (1.4 g), ethylene glycol methacrylate phosphate (3 g), and DMAC (80 g) were placed in a 250-ml 3-necked flask, equipped with magnetic stirring, temperature controller and $N_2$ inlet. The mixture was heated to 60° C. and stirred under $N_2$ protection for 6 hours after which AIBN (0.1 g) was added and the reaction was continued overnight. The reaction mixture contained 19% of Polymer G and was directly used in coating formulations.

Synthesis of Polymer H:

AIBN (0.25 g), PMI (7 g), methacrylic acid (2.4 g), ethylene glycol methacrylate phosphate (1 g), and DMAC (80 g) were placed in a 250-ml 3-necked flask, equipped with magnetic stirring, temperature controller and $N_2$ inlet. The mixture was heated to 60° C. and acrylonitrile (9.6 g) was added to the flask in 4 portions over 3 hours, after which AIBN (0.1 g) was added and the mixture was stirred under $N_2$ protection overnight. The reaction mixture contained 18% of Polymer H and was directly used in coating formulations.

Synthesis of Polymer I:

AIBN (0.25 g), PMI (7 g), acrylonitrile (10 g), methacrylic acid (3 g), and DMAC (80 g) were placed in a 250-ml 3-necked flask, equipped with magnetic stirring, temperature controller and $N_2$ inlet. The mixture was heated to 60° C. and stirred under $N_2$ protection overnight. About 19.1% solids were measured. The solution was precipitated in 1 liter of water and the solids were filtered and dried at 50° C. for 5 hours. Polymer I (17 g) was obtained.

Synthesis of Polymer J:

AIBN (0.4 g), PMI (14 g), methacrylic acid (3 g), ethylene glycol methacrylate phosphate (3 g), and DMAC (60 g) were placed in a 250-ml 3-necked flask, equipped with magnetic stirring, temperature controller and $N_2$ inlet. The mixture was heated to 80° C. and stirred under $N_2$ protection overnight. About 20.1% solids were measured. The solution was precipitated in 1 liter of water and the solids were filtered and dried at 50° C. for 5 hours. Polymer J (18 g) was obtained.

Synthesis of Polymer K:

AIBN (0.4 g), acrylonitrile (18 g), ethylene glycol methacrylate phosphate (2 g), and DMAC (80 g) were placed in a 250-ml 3-necked flask, equipped with magnetic stirring, temperature controller and $N_2$ inlet. The mixture was heated to 60° C. and stirred under $N_2$ protection overnight. The reaction mixture contained 20% of Polymer K and was directly used in coating formulations.

Synthesis of Intermediate I:

DMAC (115.7 g) and 1-adamantanamine (25 g, 0.1653 equivalent) were added to a 500 ml 2-neck glass flask equipped with a heating mantle, temperature controller, magnetic stirrer, condenser, pressure equalized addition funnel and nitrogen inlet. The reaction mixture was heated to 90° C. until the solution became clear. It was then cooled to room temperature and 24.36 g of isocyanato ethyl methacrylate (IEM, 0.1570 equivalent) was added dropwise over 30 minutes. The reaction was exothermed to 46° C. and ten minutes later it was cooled to 35° C. The reaction mixture was then stirred for an additional hour. Completion of the reaction was determined by the disappearance of the isocyanate group using IR spectroscopy at 2275 $cm^{-1}$ (UR4446). Proton NMR (in DMSO-$d_6$): δ (ppm) 1.50–2.00 (18H, m), 3.19 (2H, quartet), 3.98 (2H, t), 5.60 (1H, s), 5.65 (1H, s), 5.77 (1H, t), and 6.02 (1H, s). The NMR spectrum also showed the peaks from the solvent dimethylacetamide at 1.92, 2.74 and 2.90 ppm.

Synthesis of Polymer L:

DMAC (172.66 g), Intermediate I (11 g, 30% NV), acrylonitrile (6 g), PMI (1.5 g), methacrylic acid (1.2 g), and AIBN (0.125 g, Vazo-64 from Dupont de Nemours Co) were added to a 500 ml 4-neck ground glass flask, equipped with a heating mantle, temperature controller, mechanical stirrer, condenser, pressure equalized addition funnel and nitrogen inlet. The reaction mixture was heated to 80° C. under a nitrogen atmosphere. Then a pre-mixture containing Intermediate 1 (34 g, 30% NV), acrylonitrile (18 g), N-PMI (6 g), methacrylic acid (3.8 g), and AIBN (0.25 g, Vazo-64) was added over two hours at 80° C. After the addition, 0.4 g of AIBN were added. The reaction was continued another fourteen hours at 80° C. and during processing another 0.4 g of AIBN were added. The polymer conversion was >98% based on a determination of percent of non-volatiles. The solution viscosity at 20.1% non-volatile was “A” (G.H'33), approximately 50 cps. The resin solution was precipitated in powder form using 4500 g of water & 1500 g of ice using multi-purpose high shear laboratory mixture from Silverston (Model #L4RT-A) at 6000 RPM. The solution was then filtered and the product Polymer L was dried using a drying oven (from InterMetro Industries Corporation, PA) at 40° C. The final polymer acid number was 65.0 mg/KOH. The weight ratio of monomers intermediate I/acrylonitrile/N-phenylmaleimide/methacrylic acid was 27/48/15/10. The structure of Polymer L is shown schematically below.

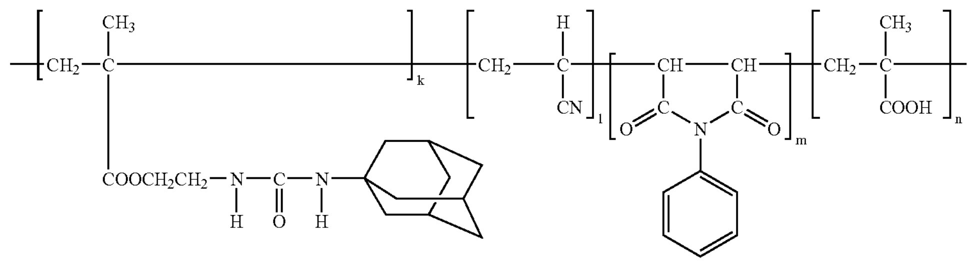

Synthesis of Polymer M:

DMAC (170.5 g), Intermediate 1 (5.5 g, 30% NV), acrylonitrile (5.25 g), PMI (2.5 g), methacrylic acid (1.25 g), and AIBN (0.125 g, Vazo-64) were added to a 500 ml 4-neck ground glass flask, equipped with a beating mantle, temperature controller, mechanical stirrer, condenser, pressure equalized addition funnel and nitrogen inlet. The reaction mixture was heated to 80° C. under nitrogen atmosphere. Then a pre-mixture containing Intermediate I (34 g, 30% NV), acrylonitrile (15 g), PMI (7.5 g), methacrylic acid (5 g), and AIBN (0.25 g, Vazo-64) was added over two hours at 80° C. After the addition is over, 0.4 g of AIBN was added and the reaction was continued another fourteen hours at 80° C. During the reaction time, AIBN (0.4 g) was added twice more. The polymer conversion was >98% based on determination of percent of non-volatiles. The solution viscosity at 20.0% non-volatile was “A” (G.H'33), approximately 50 cps. The resin solution was precipitated in powder form using 4500 g of water & 1500 g of ice using a multi-purpose high shear laboratory mixture from Silverston (Model #L4RT-A) at 6000 RPM. The solution was then filtered and the solid product was dried using a drying oven at 40° C. The final acid number of the polymer product was 80.70 mg/KOH. The weight ratio of Intermediate I/acrylonitrile/N-phenylmaleimide/methacrylic acid was 27/40.5/20/12.5.

Synthesis of Polymer N:

DMAC (170.5 g), Intermediate 1 (5.5 g, 30% NV), acrylonitrile (6.0 g), PMI (3.25 g), methacrylic acid (1.25 g), and AIBN (0.125 g, Vazo-64) were added to 500 ml 4-neck ground glass flask, equipped with a heating mantle, temperature controller, mechanical stirrer, condenser, pressure equalized addition funnel, and nitrogen inlet. The reaction mixture was heated to 80° C. under nitrogen atmosphere. Then a pre-mixture containing Intermediate 1 (34.0 g, 30% NV), acrylonitrile (18 g), PMI (9.75 g), methacrylic acid (5.0 g), and AIBN (0.25 g, Vazo-64) was added over two hours at 80° C. After the addition is over, 0.4 g of AIBN was added. The reaction was continued another fourteen hours at 80° C., during which AIBN (0.5 g) was added. The polymer conversion was >98% based on a determination of percent of non-volatiles. The solution viscosity at 20.0% non-volatile was "A" (G.H'33), approximately 50 cps. The resin solution was precipitated in powder form using 4500 g of water & 1500 g of ice using a multi-purpose high shear laboratory mixture from Silverston (Model #L4RT-A) at 6000 RPM. The solution was then filtered and the product was dried using a drying oven at 40° C. The final polymer acid number was 80.70 mg/KOH. The weight ratio of Intermediate I/acrylonitrile/N-phenylmaleimide/methacrylic acid was 13.5/48/26/12.5.

Synthesis of Intermediate II:

DMAC (115.4 g), 1-adamantanol (25 g, 0.1642 equivalent), dibutyltin dilaurate (0.25 g), and methoxy phenol (0.10 g) were charged to a 250 ml 3-neck ground glass flask, equipped with a heating mantle, temperature controller, mechanical stirrer, condenser, pressure equalized addition funnel and nitrogen inlet. The reaction mixture was heated to 60° C. The resulting solution was clear. Isocyanato ethyl methacrylate (24.20 g, 0.1560 equivalent) was then added drop wise over 60 minutes. The reaction mixture was stirred for an additional 8 hours at 65° C. Completion of reaction was determined by the disappearance of the isocyanate group using IR spectroscopy at 2275 $cm^{-1}$. Proton NMR (in DMSO-$d_6$): δ (ppm) 1.40–2.10 (18H, m), 3.16 (2H, quartet), 4.01 (2H, t), 5.63 (1H, s), 6.02 (1H, s) and 6.98 (1H, t). The NMR spectrum also showed the peaks from the solvent DMAC at 1.92, 2.74 and 2.90 ppm.

Synthesis of Polymer O:

DMAC (170.5 g), Intermediate II (11.0 g, 30% NV), acrylonitrile (5.25 g), PMI (2.5 g), methacrylic acid (1.25 g), and AIBN (0.125 g, Vazo-64) were added to 500 ml 4-neck ground glass flask, equipped with a heating mantle, temperature controller, mechanical stirrer, condenser, pressure equalized addition funnel, and nitrogen inlet. The reaction mixture was heated to 80° C. under nitrogen atmosphere. Then a pre-mixture of Intermediate-II (34.0 g, 30% NV), acrylonitrile (15.0 g), PMI (7.5 g), methacrylic acid (5.0 g), and AIBN (0.25 g, Vazo-64) was added over two hours at 80° C., after which AIBN (0.4 g) was added. The reaction was continued another fourteen hours at 80° C. during which AIBN (0.70 g) was added. The polymer conversion was >98% based on determination of percent of non-volatiles. The solution viscosity at 20.0% non-volatile was "A" (G.H'33), approximately 50 cps. The resin solution was precipitated in powder form using 4500 g of water & 1500 g of ice using multi-purpose high shear laboratory mixture from Silverston (Model #L4RT-A) at 6000 RPM. The solution was then filtered and the product was dried using a drying oven at 40° C. The final polymer acid number was 80.7 mg/KOH. The weight ratio of Intermediate II/acrylonitrile/N-phenylmaleimide/methacrylic acid was 27/40.5/20/12.5. The polymer is schematically shown below.

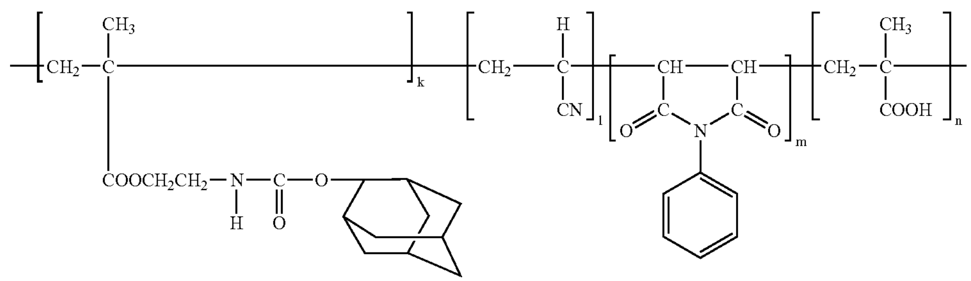

Synthesis of Polymer P:

DMAC (170.5 g), Intermediate II (5.5 g, 30% NV), acrylonitrile (6.0 g), PMI (3.25 g), methacrylic acid (1.25 g), and AIBN (0.125 g, Vazo-64) were added to 500 ml 4-neck ground glass flask, equipped with a heating mantle, temperature controller, mechanical stirrer, condenser, pressure equalized addition funnel, and nitrogen inlet. The reaction mixture was heated to 80° C. under nitrogen atmosphere. Then a pre-mixture of Intermediate-II (17.0 g, 30% NV), acrylonitrile (18.0 g), PMI (9.75 g), methacrylic acid (5.0 g), and AIBN (0.25 g, Vazo-64) was added over two hours at 80° C., after which AIBN (0.4 g) was added. The reaction was continued another fourteen hours at 80° C. during which AIBN (0.35 g) was added. The polymer conversion was >98% based on determination of percent of non-volatiles. The solution viscosity at 20.0% non-volatile was "A" (G.H'33), approximately 50 cps. The resin solution was precipitated in powder form using 4500 g of water & 1500 g of ice using multi-purpose high shear laboratory mixture from Silverston (Model #L4RT-A) at 6000 RPM. The solution was then filtered and the product was dried using a drying oven at 40° C. The final polymer acid number was 80.7 mg/KOH. The weight ratio of Intermediate II/acrylonitrile/N-phenylmaleimide/methacrylic acid was 13.5/48/26/12.5.

Synthesis of Intermediate III:

DMAC (103.4 g) and t-butyl amine (14.83 g, 0.2 equivalent) were charged to a 250 ml 3-neck ground glass flask, equipped with a heating mantle, temperature controller, magnetic stirrer, condenser, pressure equalized addition funnel and nitrogen inlet. Isocyanato ethyl methacrylate (29.5 g, 0.19 equivalent) was added drop wise over 30 minutes at room temperature. The reaction was exothermed to 37° C. and ten minutes later, it was heated to 40° C. The reaction mixture was stirred for an additional 1 hour. Completion of the reaction was determined by the disappearance of the isocyanate group using IR spectroscopy at 2275 $cm^{-1}$.

Synthesis of Polymer Q:

DMAC (170.5 g), Intermediate III (11.0 g, 30% NV), acrylonitrile (5.25 g), PMI (2.5 g), methacrylic acid (1.25 g), and AIBN (0.125 g, Vazo-64) were added to a 500 ml 4-neck ground glass flask, equipped with a heating mantle, temperature controller, mechanical stirrer, condenser, pressure equalized addition funnel, and nitrogen inlet. The reaction mixture was heated to 80° C. under nitrogen atmosphere. Then, a pre-mixture of Intermediate III (34.0 g, 30% NV), acrylonitrile (15.0 g), PMI (7.5 g), methacrylic acid (5.0 g), and AIBN (0.25 g, Vazo-64) were added over two hours at 80° C. After the addition was over, AIBN (0.4 g) was added again. The reaction was continued another fourteen hours at 80° C. during which AIBN (1.2 g) was added again. The polymer conversion was 98% based on a determination of percent of non-volatiles. The solution viscosity at 20.0% non-volatile was "A" (G.H'33), approximately 50 cps. The resin solution was precipitated in powder form using 4500 g of water & 1500 g of ice using a multi-purpose high shear laboratory mixture from Silverston (Model #L4RT-A) at 4000 RPM. The solution was then filtered and the product was dried using a drying oven at 40° C. The final polymer acid number was 80.7 mg/KOH. The weight ratio of Intermediate III/acrylonitrile/N-phenylmaleimide/methacrylic acid was 27/40.5/20/12.5. The polymer is schematically represented below.

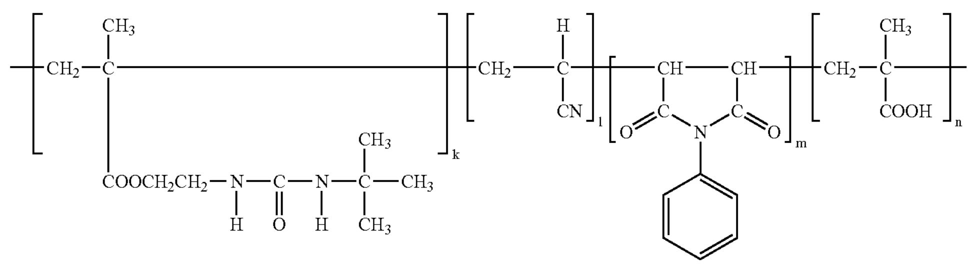

EXAMPLE 1

Positive-Working Single-Layer Imageable Elements

Single-layer imageable elements were prepared by dissolving the ingredients for Formulations 1, 2, 3, 4, 5a and 5b shown in the following TABLE I in the solvent. For comparison, Formulations 1, 2 and 3 contained about 10% solvent resistant binder (Polymers A–C) while Formulations 4, 5a and 5b did not include these binders.

TABLE I

| Ingredient | Formulation 1 (wt %) | Formulation 2 (wt %) | Formulation 3 (wt %) | Formulation 4 (wt %) | Formulation 5a (wt %) | Formulation 5b (wt %) |
|---|---|---|---|---|---|---|
| LB6564 | 30.6 | 40.1 | 30.6 | 63.3 | 63.3 | 63.3 |
| PD494 | 0 | 0 | 0 | 0 | 24.8 | 24.8 |
| Durez 33816 | 43.4 | 33.9 | 43.4 | 24.8 | — | — |
| Inventive Polymer | Polymer A (10.2) | Polymer B (10.2) | Polymer C (10.2) | 2.0* | 2.0* | 2.0* |
| XDSA | 5.6 | 5.6 | 5.6 | 5.5 | — | — |
| Basonyl violet | 1.9 | 1.9 | 1.9 | 1.9 | 2 | 2 |
| KF654b | 0.5 | 0.5 | 0.5 | 0.5 | 0.5 | 0.5 |
| IR Dye A | 1.4 | 1.4 | 1.4 | 1.4 | 1.0 | 1.0 |
| Silikophen P50X | 6 | 6 | 6 | 6 | 6 | 6 |
| Byk ® 307 | 0.4 | 0.4 | 0.4 | 0.4 | 0.4 | 0.4 |
| | Weight % | Weight % | Weight % | Weight % | Weight % | Weight % |
| Dioxolane | | | | | 65 | |
| MEK | 65 | 65 | 60 | 20 | | 20 |
| PGME | 15 | 15 | 10 | 80 | 15 | 80 |
| BLO | 10 | 10 | 30 | | 10 | |
| Water | 10 | 10 | | | 10 | |

*Cellulose acetate hydrogen phthalate (Sigma-Aldrich) is used as solvent resistant component.

All formulations were coated on the same batch of grained and anodized aluminum to obtain a dry coating weight of 1.50 g/m$^2$ on all elements by means of a Meyer bar. The solvents were removed by drying at a temperature of 123° C. for 50 seconds. After the imageable elements were coated and dried, they were conditioned at a temperature of 55° C. and a relative humidity of 80% RH for 72 hours.

After conditioning, the imageable elements were imaged using a conventional Creo Trendsetter 3244 (Creo Inc. Burnaby, British Columbia, Canada), followed by development in a Mercury of the Americas processor (Kodak Polychrome Graphics) containing commercially available Goldstar Plus developer at 23° C. at a processing speed of 750 mm/min.

The digital imaging speed and solvent resistance of the imageable elements were determined using the following methods. The results are summarized in TABLE II below.

The digital imaging speed of the plates was defined as the level of exposure (as measured in mJ/cm$^2$) that is required to clean out a region of a 50% checkerboard pattern as determined using a D196 densitometer (Gretag MacBeth, Regensdorf, Switzerland).

Solvent resistance was measured by reading the ΔOD (Δ optical density) of a solid area before and after soaking in a concentrated fountain solution for 8 hours. The concentrated fountain solution consisted of 6% of Astro Mark 3 fountain additive (Nikken Chemical Ltd., Tokyo, Japan), 10% of iso-propyl alcohol (Sigma-Aldrich St Louis, Mo.), and 84% of water purified by reverse osmosis.

TABLE II

| Formulation | Digital Speed (mJ) | Solvent Resistance (ΔOD) |
|---|---|---|
| 1 | 160 | −0.04 |
| 2 | 200 | −0.06 |
| 3 | 200 | 0.00 |
| 4 | 160 | −0.10 |
| 5a | 170 | −0.23 |
| 5b | 160 | −0.16 |

The results show that the use of all three of Polymers A, B, and C in Formulations 1–3 improved the chemical resistance of the resulting coatings (that is, there was little change in OD before and after soaking in the fountain solution).

EXAMPLE 2

Positive-Working Multi-Layer Imageable Elements

Multi-layer imageable elements were prepared as follows:

Bottom (inner) layer: A coating formulation was prepared by dissolving inventive Polymer (6.0137 g, TABLE III) in a solvent mixture of BLO (9.27 g), PGME (13.9 g), MEK (60.26 g), and water (9.27 g). IR Dye A (1.06 g) was then added to this solution followed by BYK® 307 (0.211 g). The resulting solution was coated onto an aluminum substrate to achieve a 1.5 g/m$^2$ dry coating weight.

Top (outer) layer: A coating formulation of P-3000 (1.5025 g), PD-140 (3.4685 g), ethyl violet (0.014 g), BYK® 307 (0.149 g) in DEK (85.38 g) and acetone (9.48 g) was coated over the bottom (outer) layer to give a dry coating weight of 0.5 g/m$^2$.

The imageable elements were thermally imaged on a conventional Creo Trendsetter 3244 (Creo Products, Burnaby, BC, Canada) having a laser diode array emitting at 830 nm with a variety of exposure energies from 80 to 140 mJ/cm$^2$. The exposed elements were developed using 956 Developer (Kodak Polychrome Graphics, Norwalk, Conn., USA). The exposed areas were removed to reveal hydrophilic substrate.

The elements containing Polymers A, C-1, C-2, and H exhibited good images at <120 mJ/cm$^2$ exposure after development. The “Developer Clean Time” (that is, the time for completely or fully removing the inner layer with no outer layer present, when developer is applied) was also observed.

The solvent resistance and thermal bakeability of the elements containing the various Polymers in the inner were measured by following methods and their results were summarized in TABLE III below.

(a) BC drop test: A butyl cellosolve (80% in water) solution was dropped onto the inner layer surface at regular intervals up to 15 minutes. The ratings used were: Excellent (no obvious coating damage up to 15 minutes), Good (no obvious coating damage up to 10 minutes), and Poor (obvious coating damage in 5 minutes).

(b) DAA drop test: A diacetone alcohol (80% in water) solution was dropped onto the inner layer surface at regular intervals up to 15 minutes. The ratings used were: Excellent (no obvious coating damage up to 15 minutes), Good (no obvious coating damage up to 10 minutes), and Poor (obvious coating damage in 5 minutes).

(c) Thermal Bakeability test: A PS plate image remover, PE-35 (from DIC, Japan), was applied onto the inner layer surface that had been baked at 230° C. for 8 minutes, at regular intervals up to 5 minutes. The ratings used were: Excellent (no obvious coating damage up to 5 minutes), Good (no obvious coating damage up to 1 minute), and Poor (obvious coating damage in 1 minute).

TABLE III

| Polymer ID | Developer Clean Time (seconds) | BC drop test | DAA drop test | Thermal Bakeability |
|---|---|---|---|---|
| A | 5 | Good | Good | Good |
| D | >30 | Excellent | Excellent | Good |
| B | >30 | Excellent | Excellent | Good |
| E | >30 | Good | Poor | Poor |
| F | >30 | Excellent | Excellent | Good |
| G | >30 | Excellent | Excellent | Good |
| C-1 | 5–10 | Excellent | Good | Excellent |
| C-2 | 5–10 | Excellent | Good | Excellent |
| H | 5 | Excellent | Good | Good |
| I | 5–10 | Good | Poor | Poor |
| J | 5–10 | Poor | Good | Poor |
| K | N/a | Excellent | Poor | Excellent |

These results show that the polymers containing recurring units derived from ethylene glycol methacrylate phosphate and acrylonitrile provided improved solvent resistance and thermal bakeability. Considering all three properties, developability, chemical resistance and thermal bakeability together, Polymers C-1 and C-2 were the best polymers to use in the inner layer.

EXAMPLE 3

Positive-Working Multilayer Imageable Elements

Multilayer imageable elements were prepared as follows:

Bottom (inner) layer: A coating formulation was prepared by dissolving an inventive Polymer (6.0137 g, TABLE IV)

described above in a solvent mixture of BLO (9.27 g), PGME (13.9 g), MEK (60.26 g), and water (9.27 g). IR Dye A (1.06 g) was then added to this solution followed by BYK® 307 (0.211 g). The resulting solution was coated onto an aluminum lithographic substrate to achieve a 1.5 g/m$^2$ coating weight.

Top (outer) layer: A coating formulation of P-3000 (1.5025 g), PD-140 (3.4685 g,), ethyl violet (0.014 g), BYK® 307 (0.149 g) in DEK (85.38 g) and acetone (9.48 g) was coated over the described bottom (inner) layer to give a coating weight of 0.5 g/m$^2$.

The resulting imageable elements were thermally imaged on a Creo Trendsetter 3244 (Creo Products, Burnaby, BC, Canada) having a laser diode array emitting at 830 nm with a variety of exposure energies of from 100 to 200 mJ/cm$^2$. The exposed elements were developed using 956 Developer (Kodak Polychrome Graphics, Norwalk, Conn., USA). The exposed regions were removed to reveal the hydrophilic substrate.

The elements containing Polymers L, M, N, O, P and Q provided good images at 140–180 mJ/cm$^2$ exposures after development. The "Developer Clean Time" (that is, the time for completely or fully removing the inner layer with no outer layer present, when developer is applied) was also observed.

The properties of the solvent resistance and thermal bakeability of the elements containing Polymers L–Q were measured by following methods and their results were summarized in TABLE IV below. The tests were carried out as described in Example 2 above.

TABLE IV

| Polymer | Developer clean time (seconds) | BC drop test | DAA drop test | Thermal Bakeability |
|---|---|---|---|---|
| L | 20 | Excellent | Good | Excellent |
| M | 10 | Excellent | Good | Excellent |
| N | 15 | Excellent | Good | Excellent |
| O | 20 | Excellent | Good | Excellent |
| P | 25 | Excellent | Good | Excellent |
| Q | 10 | Poor | Poor | Excellent |

The results show that the use of the polymer containing pendant adamantyl groups provided improved chemical resistance while maintaining desired thermal bakeability.

EXAMPLE 4

Negative-Working Multi-Layer Imageable Element

A coating formulation was prepared by dissolving 0.58 g of Polymer N, 0.69 g of aurethane acrylate (UR 3447, prepared by reacting Desmodur 100 with hydroxyethyl acrylate and pentaerythritol triacrylate), 0.12 g of Sartomer 355 (ditrimethylolpropane tetraacrylate, Sartomer Co., Inc.,) 0.068 g of 2-(4-methoxyphenyl)-4,6-bis(trichloromethyl)-2-triazine, 0.036 g of N-phenyliminodiacetic acid, 0.023 g of IR Dye B, 0.017 g of crystal violet (PCAS, Longjumeau, France), and 0.03 g of 10% Byk® 307 in 8.16 g of PGME, 8.21 g of MEK and 1.85 g of BLO.

An electrochemically grained and anodized aluminum substrate, that has been post-treated with phosphorus fluoride, was coated with the noted formulation to provide an inner layer with a dry coating weight of about 1.2 g/m$^2$. The coating formulation was applied by using a wire-wound rod and then dried for approximately 30 seconds residence time in a Ranar conveyor oven set at about 90° C.

A outer layer formulation was prepared by mixing 16.3 g of 9.7% Airvol 203 (a polyvinyl alcohol) in water, 1.39 g of a 20% solution of poly(vinyl imidazole) in water, 1.18 g of 2-propanol, and 11.1 g of water. Applying this formulation in a similar manner as the inner layer formulation, provided yielded a two-layer element with a dry inner layer coating weight of about 0.8 g/m$^2$.

The resulting imageable element (i.e. printing plate precursor) was placed on a CREO Trendsetter 3244x image setter (Creo, Burnaby, British Columbia, Canada, a subsidiary of Eastman Kodak Company) and exposed to 830 nm IR laser at imaging energies of from 80 to 420 mJ/cm$^2$. The resulting printing plate was then developed in 956 Developer (manufactured by Kodak Polychrome Graphics, Norwalk, Conn.) at 25° C. A strong, solid image was obtained in the exposed regions at an imaging energy of about 250 mJ/cm$^2$.

EXAMPLE 5

Negative-Working Multi-Layer Imageable Element

A coating formulation was prepared by dissolving 0.58 g of Polymer P, 0.69 g of UR3447, 0.12 g of Sartomer 355, 0.068 g of 2-(4-methoxyphenyl)-4,6-bis(trichloromethyl)-2-triazine, 0.036 g of N-phenyliminodiacetic acid, 0.023 g of IR Dye B), 0.017 g of crystal violet (PCAS, Longjumeau, France), and 0.03 g of 10% Byk® 307 in 8.16 g of PGME, 8.21 g of MEK and 1.85 g of BLO. An electrochemically grained and anodized aluminum substrate that has been post-treated with phosphorus fluoride, was coated with this formulation as described in Example 4 to provide an inner layer having a dry coating weight of about 1.2 g/m$^2$.

An outer layer formulation was prepared by mixing 16.3 g of 9.7% Airvol 203 in water, 1.39 g of 20% poly(vinyl imidazole) in water, 1.18 g of 2-propanol, and 11.1 g of water. The outer layer was applied in a similar manner to provide a two-layer imageable element having an outer layer dry coating weight of about 0.8 g/m$^2$.

The resulting imageable element was imaged and developed as described in Example 4. A strong, solid image was obtained in the exposed regions at an imaging energy of about 250 mJ/cm$^2$.

EXAMPLE 6

Negative-Working Multi-layer Imageable Element

A coating formulation was prepared by dissolving 0.58 g of Polymer C-2, 0.69 g of UR3447, 0.12 g of Sartomer 355, 0.068 g of 2-(4-methoxyphenyl)-4,6-bis(trichloromethyl)-2-triazine, 0.036 g of N-phenyliminodiacetic acid, 0.023 g of IR Dye B), 0.017 g of crystal violet (PCAS, Longjumeau, France), and 0.03 g of 10% Byk® 307 in 8.16 g of PGME, 8.21 g of MEK and 1.85 g of BLO. An electrochemically grained and anodized aluminum substrate, that had been post-treated with phosphorus fluoride, was coated with this formulation as described in Example 4, resulting in an inner layer with a dry coating weight of about 1.2 g/m$^2$.

An outer layer formulation was prepared by mixing 16.3 g of 9.7% Airvol 203 in water, 1.39 g of 20% poly(vinyl imidazole) in water, 1.18 g of 2-propanol, and 11.1 g of water. The outer layer formulation was applied in a similar manner to yield a two-layer imageable element having an outer layer dry coating weight of about 0.8 g/m$^2$.

The resulting imageable element was imaged and developed as described in Example 4. A weak image was obtained in the exposed regions at an imaging energy of about 400 $mJ/cm^2$.

The invention has been described in detail with particular reference to certain preferred embodiments thereof, but it will be understood that variations and modifications can be effected within the spirit and scope of the invention.

The invention claimed is:

1. An imageable element comprising a substrate having thereon an imageable layer, said element further comprising a radiation absorbing compound and a solvent-resistant polymer comprising a polymer backbone and pendant adamantyl groups that are connected to said polymer backbone through a urea or urethane linking group.

2. The element of claim 1 wherein said solvent-resistant polymer is represented by the following Structure (I):

$$—(A)_x—(B)_y— \quad (I)$$

wherein A and B together represents said polymer backbone in which A further comprises recurring units comprising said pendant adamantyl groups, B further represents different recurring units, x represents 5 to 100 weight %, and y represents 0 to 95 weight %.

3. The element of claim 2 wherein B represents recurring units derived from a styrenic monomer, (meth)acrylamide, (meth)acrylic acid or ester thereof, (meth)acrylonitrile, vinyl acetate, maleic anhydride, N-substituted maleimide, or mixtures thereof.

4. The element of claim 2 wherein x is from about 5 to about 40 weight %.

5. The element of claim 1 wherein said radiation absorbing compound is an infrared radiation absorbing dye that absorbs radiation at a wavelength of from about 700 to about 1200 nm that is present in an amount of from about 0.5 to about 20 weight % based on the total dry weight of the layer in which it is located.

6. The element of claim 1 that is a positive-working lithographic printing plate precursor.

7. The element of claim 1 that is a negative-working imageable element wherein said imageable layer comprises said solvent-resistant polymer, said radiation absorbing compound that is an IR absorbing compound, a free-radical polymerizable compound, and a free-radical generating composition.

8. The element of claim 7 wherein said free-radical polymerizable compound is an unsaturated free-radical polymerizable monomer or oligomer or a free-radical crosslinkable polymer, and said free-radical generating composition comprises: (a) a triazine, (b) an azinium compound, (c) a polyhalogenated free-radical producing compound, (d) a combination of a polyhaloalkyl-substituted free-radical producing compound and a carboxy-substituted carboaromatic compound, (e) a combination of an azinium compound and a carboxy-substituted carboaromatic compound, (f) a benzoyl peroxide, hydroperoxide, or azo compound, (g) a diaryliodonium salts and a photosensitizer, (h) borate or an organoborate salts, (i) onium salt, or a combination thereof.

9. The element of claim 1 wherein said solvent-resistant polymer has recurring units derived from the compounds represented by the following Structure A1:

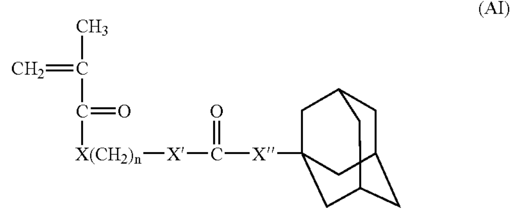

wherein X is oxy, thio, or —NH—, X' is —NH— or oxy, X" is oxy or —NH—, and n is 1 to 6.

10. The element of claim 1 wherein said imageable layer is the only imageable layer and comprises said radiation absorbing compound and said solvent-resistant polymer disposed on said substrate.

11. The element of claim 10 wherein said solvent-resistant polymer is represented by the following Structure (II):

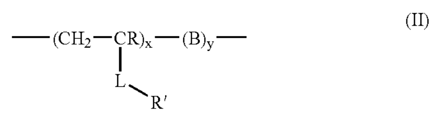

wherein R represents hydrogen, a lower alkyl group, or a halo group,

R' represents a pendant adamantyl group, L comprises a urea or urethane linking group, B represents different recurring units, and x represents from about 5 to about 40 weight % and y represents from about 60 to about 95 weight %.

12. The element of claim 11 wherein B represents recurring units derived from a styrenic monomer, (meth)acrylamide, (meth)acrylic acid or ester thereof, (meth)acrylonitrile, vinyl acetate, maleic anhydride, N-substituted maleimide, or mixtures thereof.

13. The element of claim 7 wherein the coating weight for said single imageable layer is from about 0.5 to about 2.5 $g/m^2$.

14. The element of claim 1 that is positive-working and comprises, on said substrate, in order:

an inner layer comprising said radiation absorbing compound and said solvent-resistant polymer comprising pendant adamantyl groups, and an ink receptive outer layer that is not removable using alkaline developer before its exposure to imaging radiation.

15. The element of claim 14 wherein said solvent-resistant polymer is represented by the following Structure (II):

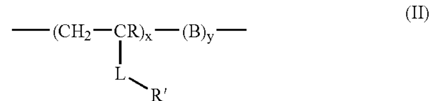

wherein R represents hydrogen, a lower alkyl group, or a halo group,

R' represents a pendant adamantyl group, L comprises a urea or urethane linking group, B represents different recurring units, and x represents from about 5 to about 40 weight % and y represents from about 60 to about 95 weight %.

16. The element of claim 15 wherein B represents recurring units derived from a styrenic monomer, (meth)acrylamide, (meth)acrylic acid or ester thereof, (meth)acrylonitrile, vinyl acetate, N-substituted maleimide, maleic anhydride, or mixtures thereof.

17. The element of claim 15 wherein x is from about 5 to about 30 weight %, and B represents recurring units derived from:

a) one or more of styrene, N-phenylmaleimide, methacrylic acid, and methyl methacrylate, wherein these recurring units comprise from 0 to about 70 weight % of all recurring units in said solvent-resistant polymer, and b) one or more of acrylonitrile or methacrylonitrile, or mixtures thereof, wherein these recurring units comprise from about 20 to about 95 weight % of all recurring units in said solvent-resistant polymer.

18. The element of claim 14 wherein said outer layer comprises a phenolic resin binder and said radiation absorbing compound is an infrared radiation absorbing compound that is present in an amount of from about 8 to about 25 weight % based on the total dry weight of said inner layer.

19. A method for forming an image comprising:

A) thermally imaging the imageable element of claim 1, thereby forming an imaged element with exposed and non-exposed regions, B) contacting said imaged layer with an alkaline developer to remove either only said exposed regions or only said non-exposed regions, and C) optionally, baking said imaged and developed element.

20. The method of claim 19 wherein only said exposed regions are removed, providing a positive-working imaged element.

21. The method of claim 19 wherein only said non-exposed regions are removed, providing a negative-working imaged element.

22. A negative-working imageable element comprising a substrate having thereon a negative-working imageable layer comprising a radiation absorbing compound and a solvent-resistant polymer comprising a polymer backbone and pendant phosphoric acid groups.

23. The element of claim 22 wherein said solvent-resistant polymer is represented by the following Structure (I):

$$—(A)_x—(B)_y— \quad (I)$$

wherein A and B together represents said polymer backbone in which A further comprises recurring units comprising pendant phosphoric acid groups, B further represents different recurring units, x represents 5 to 100 weight %, and y represents 0 to 95 weight %.

24. The element of claim 23 wherein B represents recurring units derived from a styrenic monomer, (meth)acrylamide, (meth)acrylic acid or ester thereof, (meth)acrylonitrile, vinyl acetate, maleic anhydride, N-substituted maleimide, or mixtures thereof.

25. The element of claim 23 wherein x is from about 5 to about 20 weight %.

26. The element of claim 22 wherein said radiation absorbing compound is an infrared radiation absorbing dye that absorbs radiation at a wavelength of from about 700 to about 1200 nm that is present in an amount of from about 0.5 to about 20 weight % based on the total dry weight of said imageable layer in which it is located.

27. The element of claim 22 wherein said imageable layer comprises an IR absorbing compound, a free-radical polymerizable compound, and a free-radical generating composition.

28. The element of claim 27 wherein said free-radical polymerizable compound is an unsaturated free-radical polymerizable monomer or oligomer or a free-radical crosslinkable polymer, and said free-radical generating composition comprises: (a) a triazine, (b) an azinium compound, (c) a polyhalogenated free-radical producing compound, (d) a combination of a polyhaloalkyl-substituted free-radical producing compound and a carboxy-substituted carboaromatic compound, (e) a combination of an azinium compound and a carboxy-substituted carboaromatic compound, (f) a benzoyl peroxide, hydroperoxide, or azo compound, (g) a diaryliodonium salts and a photosensitizer, (h) borate or an organoborate salts, (i) onium salt, or a combination thereof.

29. The element of claim 22 wherein said solvent-resistant polymer has recurring units derived from one or more of the following compounds represented by the following Structures A2 through A5:

(A2)

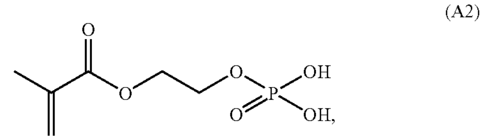

(A3)

(A4)

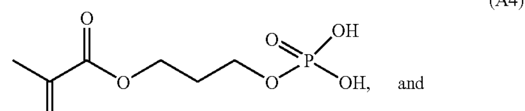

(A5)

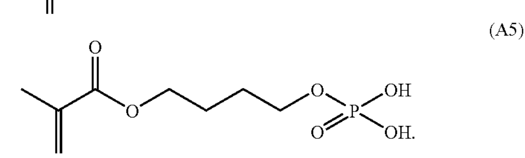

30. The element of claim 22 wherein the coating weight for said single imageable layer is from about 0.5 to about 2.5 $g/m^2$.

31. A method for forming an image comprising:

A) thermally imaging the imageable element of claim 22, thereby forming an imaged element with exposed and non-exposed regions, B) contacting said imaged layer with an alkaline developer to remove only said non-exposed regions, and C) optionally, baking said imaged and developed element.

32. A positive-working imageable element comprising a substrate having thereon, in order:

an inner layer comprising a radiation absorbing compound and a solvent-resistant polymer comprising pendant phosphoric acid groups, and an ink receptive outer layer that is not removable using alkaline developer before its exposure to imaging radiation, is substantially free of radiation absorbing compound, and has a dry coating coverage of from about 0.4 to about 0.7 $g/m^2$.

33. The element of claim 32 wherein said solvent-resistant polymer is represented by the following Structure (I):

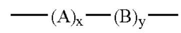

(I)

wherein A and B together represents said polymer backbone in which A further comprises recurring units comprising pendant phosphoric acid groups, B further represents different recurring units, x represents 5 to 100 weight %, and y represents 0 to 95 weight %.

34. The element of claim 33 wherein B represents recurring units derived from a styrenic monomer, (meth)acrylamide, (meth)acrylic acid or ester thereof, (meth)acrylonitrile, vinyl acetate, maleic anhydride, N-substituted maleimide, or mixtures thereof.

35. The element of claim 33 wherein B represents recurring units derived from one or more of styrene, N-phenylmaleimide, methacrylic acid, (meth)acrylonitrile, and methyl methacrylate.

36. The element of claim 33 wherein x is from about 5 to about 20 weight %.

37. The element of claim 32 wherein said radiation absorbing compound is an infrared radiation absorbing dye that absorbs radiation at a wavelength of from about 700 to about 1200 nm that is present only in said inner layer in an amount of from about 8 to about 30 weight % based on the total dry weight of said inner layer.

38. The element of claim 32 wherein said solvent-resistant polymer has recurring units derived from one or more of the following compounds represented by the following Structures A2 through A5:

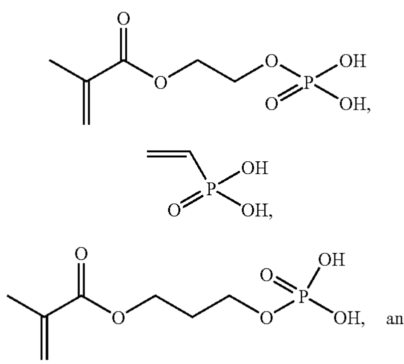

(A2), (A3), (A4) and

-continued

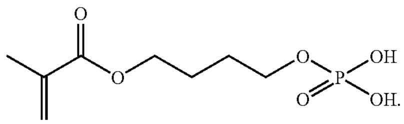

(A5)

39. The element of claim 32 wherein said solvent-resistant polymer is represented by the following Structure (II):

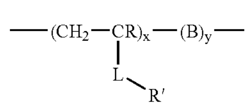

(II)

wherein R represents hydrogen, a lower alkyl group, or a halo group,

L represents a direct bond or a linking group,

R' represents a phosphoric acid group,

B represents different recurring units, x represents from about 5 to about 30 weight %, and y represents 70 to 95 weight %.

40. The element of claim 39 wherein said inner layer has a dry coating coverage of from about 1 to about 2 g/m$^2$.

41. The element of claim 39 wherein x is from about 5 to about 20 weight %, and B represents recurring units derived from:

a) one or more of styrene, N-phenylmaleimide, methacrylic acid, and methyl methacrylate, wherein these recurring units comprise from 0 to about 70 weight % of all recurring units in said solvent-resistant polymer, and b) one or more of acrylonitrile or methacrylonitrile, or mixtures thereof, wherein these recurring units comprise from about 80 to about 95 weight % of all recurring units in said solvent-resistant polymer.

42. The element of claim 39 wherein x is from about 5 to about 20 weight %.

43. A method for forming an image comprising:

A) thermally imaging the imageable element of claim 32, thereby forming an imaged element with exposed and non-exposed regions, B) contacting said imaged layer with an alkaline developer to remove only said exposed regions, and C) optionally, baking said imaged and developed element.

* * * * *